United States Patent
Pickard et al.

(10) Patent No.: US 8,441,179 B2
(45) Date of Patent: May 14, 2013

(54) LIGHTING DEVICES HAVING REMOTE LUMIPHORS THAT ARE EXCITED BY LUMIPHOR-CONVERTED SEMICONDUCTOR EXCITATION SOURCES

(75) Inventors: Paul Pickard, Morrisville, NC (US); Antony Paul Van de Ven, Sai Kung (HK); Ronan P. LeToquin, Fremont, CA (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/105,184

(22) Filed: May 11, 2011

(65) Prior Publication Data

US 2011/0273079 A1 Nov. 10, 2011

Related U.S. Application Data

(63) Continuation of application No. 11/624,811, filed on Jan. 19, 2007, now Pat. No. 8,264,138.

(60) Provisional application No. 60/760,455, filed on Jan. 20, 2006, provisional application No. 60/761,310, filed on Jan. 23, 2006, provisional application No. 60/794,379, filed on Apr. 24, 2006.

(51) Int. Cl.
*H01L 33/50* (2010.01)
*H01L 33/54* (2010.01)

(52) U.S. Cl.
USPC ............ 313/501; 313/512; 313/485; 313/486

(58) Field of Classification Search .......... 313/498–512, 313/483–487
See application file for complete search history.

(56) References Cited

U.S. PATENT DOCUMENTS

| | | | |
|---|---|---|---|
| 4,042,552 | A | 8/1977 | Grucza |
| 4,107,238 | A | 8/1978 | Roper et al. |
| 4,141,941 | A | 2/1979 | Travnicek |
| 4,320,268 | A | 3/1982 | Brown |
| 4,337,506 | A | 6/1982 | Terada |

(Continued)

FOREIGN PATENT DOCUMENTS

| | | |
|---|---|---|
| EP | 1 263 058 | 2/2002 |
| EP | 1 198 016 | 4/2002 |

(Continued)

OTHER PUBLICATIONS

U.S. Appl. No. 61/047,824, filed Apr. 24, 2008, Le Toquin.

(Continued)

*Primary Examiner* — Mariceli Santiago
(74) *Attorney, Agent, or Firm* — Myers Bigel Sibley & Sajovec

(57) ABSTRACT

Lighting devices include a semiconductor light emitting device and first and second spaced-apart lumiphors. The first lumiphor has a first surface that is positioned to receive radiation emitted by the semiconductor light emitting device and a second surface opposite the first surface. The second lumiphor has a first surface that is positioned to receive radiation emitted by the semiconductor light emitting device and radiation emitted by the luminescent materials in the first lumiphor. The first lumiphor is a leaky lumiphor in that the luminescent materials therein wavelength convert less than 90% of the radiation from the semiconductor light emitting device light that is incident on the first lumiphor.

19 Claims, 14 Drawing Sheets

U.S. PATENT DOCUMENTS

| | | | |
|---|---|---|---|
| 4,388,678 A | 6/1983 | Turner |
| 4,562,018 A | 12/1985 | Neefe |
| 4,826,424 A | 5/1989 | Arai et al. |
| 4,918,497 A | 4/1990 | Edmond |
| 4,933,822 A | 6/1990 | NakaMats |
| 4,966,862 A | 10/1990 | Edmond |
| 4,994,946 A | 2/1991 | NakaMats |
| 5,027,168 A | 6/1991 | Edmond |
| 5,087,949 A | 2/1992 | Haitz |
| 5,110,278 A | 5/1992 | Tait et al. |
| 5,134,550 A | 7/1992 | Young |
| 5,143,660 A | 9/1992 | Hamilton et al. |
| 5,210,051 A | 5/1993 | Carter, Jr. |
| 5,277,840 A | 1/1994 | Osaka et al. |
| 5,338,944 A | 8/1994 | Edmond et al. |
| 5,374,668 A | 12/1994 | Kanemura et al. |
| 5,393,993 A | 2/1995 | Edmond et al. |
| 5,416,342 A | 5/1995 | Edmond et al. |
| 5,477,430 A | 12/1995 | LaRose |
| 5,523,589 A | 6/1996 | Edmond et al. |
| 5,575,550 A | 11/1996 | Appeldorn et al. |
| 5,604,135 A | 2/1997 | Edmond et al. |
| 5,631,190 A | 5/1997 | Negley |
| 5,669,486 A | 9/1997 | Shima |
| 5,739,554 A | 4/1998 | Edmond et al. |
| 5,753,730 A | 5/1998 | Nagata et al. |
| 5,779,924 A | 7/1998 | Krames et al. |
| 5,813,753 A | 9/1998 | Vriens et al. |
| 5,851,063 A | 12/1998 | Doughty et al. |
| 5,858,278 A | 1/1999 | Itoh et al. |
| 5,882,553 A | 3/1999 | Prophet et al. |
| 5,906,425 A | 5/1999 | Gordin et al. |
| 5,912,477 A | 6/1999 | Negley |
| 5,959,316 A | 9/1999 | Lowery |
| 5,968,422 A | 10/1999 | Kennedy |
| 6,066,861 A | 5/2000 | Hohn et al. |
| 6,069,440 A | 5/2000 | Shimizu et al. |
| 6,071,795 A | 6/2000 | Cheung et al. |
| 6,120,600 A | 9/2000 | Edmond et al. |
| 6,155,699 A | 12/2000 | Miller et al. |
| 6,156,242 A | 12/2000 | Saito et al. |
| 6,177,688 B1 | 1/2001 | Linthicum et al. |
| 6,187,606 B1 | 2/2001 | Edmond et al. |
| 6,201,262 B1 | 3/2001 | Edmond et al. |
| 6,234,648 B1 | 5/2001 | Borner et al. |
| 6,252,254 B1 | 6/2001 | Soules et al. |
| 6,329,676 B1 | 12/2001 | Takayama et al. |
| 6,346,973 B1 | 2/2002 | Shibamoto et al. |
| 6,350,041 B1 | 2/2002 | Tarsa et al. |
| 6,373,188 B1 | 4/2002 | Johnson et al. |
| 6,383,417 B1 | 5/2002 | Paulson et al. |
| 6,391,231 B1 | 5/2002 | Evans et al. |
| 6,404,125 B1 | 6/2002 | Garbuzov et al. |
| 6,404,131 B1 | 6/2002 | Kawano et al. |
| 6,420,199 B1 | 7/2002 | Coman et al. |
| 6,504,180 B1 | 1/2003 | Heremans et al. |
| 6,521,915 B2 | 2/2003 | Odaki et al. |
| 6,559,075 B1 | 5/2003 | Kelley et al. |
| 6,573,653 B1 | 6/2003 | Ishingaga |
| 6,576,930 B2 | 6/2003 | Reeh et al. |
| 6,600,175 B1 | 7/2003 | Baretz et al. |
| 6,601,984 B2 | 8/2003 | Yamamoto et al. |
| 6,635,363 B1 | 10/2003 | Duclos et al. |
| 6,657,236 B1 | 12/2003 | Thibeault et al. |
| 6,730,939 B2 | 5/2004 | Eisert et al. |
| 6,734,465 B1 | 5/2004 | Taskar et al. |
| 6,744,077 B2 | 6/2004 | Trottier |
| 6,800,500 B2 | 10/2004 | Coman et al. |
| 6,809,347 B2 | 10/2004 | Tasch et al. |
| 6,841,804 B1 | 1/2005 | Chen et al. |
| 6,853,131 B2 | 2/2005 | Srivastava et al. |
| 6,871,982 B2 | 3/2005 | Holman et al. |
| 6,960,878 B2 | 11/2005 | Sakano et al. |
| 7,005,679 B2 | 2/2006 | Tarsa et al. |
| 7,029,935 B2 | 4/2006 | Negley et al. |
| 7,040,774 B2 | 5/2006 | Beeson et al. |
| 7,042,020 B2 | 5/2006 | Negley |
| 7,095,056 B2 | 8/2006 | Vitta et al. |
| 7,144,131 B2 | 12/2006 | Rains |
| 7,213,940 B1 | 5/2007 | Van de Ven et al. |
| 7,261,441 B2 | 8/2007 | Ng et al. |
| 7,264,378 B2 | 9/2007 | Loh |
| 7,265,488 B2 | 9/2007 | Ng et al. |
| 7,293,908 B2 | 11/2007 | Beeson et al. |
| 7,311,858 B2 * | 12/2007 | Wang et al. ................... 313/503 |
| 7,326,583 B2 | 2/2008 | Andrews et al. |
| 7,360,937 B2 | 4/2008 | Han et al. |
| 7,614,759 B2 | 11/2009 | Negley |
| 7,703,945 B2 | 4/2010 | Leung et al. |
| 7,718,991 B2 | 5/2010 | Negley |
| 7,722,220 B2 | 5/2010 | Van de Ven |
| 7,737,621 B2 * | 6/2010 | Masuda et al. ................ 313/501 |
| 7,828,460 B2 | 11/2010 | Van de Ven et al. |
| 7,852,009 B2 | 12/2010 | Coleman et al. |
| 7,852,010 B2 | 12/2010 | Negley |
| 7,862,214 B2 | 1/2011 | Trott et al. |
| 7,901,111 B2 | 3/2011 | Negley et al. |
| 7,959,329 B2 | 6/2011 | Van de Ven |
| 8,008,676 B2 | 8/2011 | Negley et al. |
| 8,011,818 B2 | 9/2011 | Negley |
| 8,029,155 B2 | 10/2011 | Van de Ven et al. |
| 8,033,692 B2 | 10/2011 | Negley et al. |
| 2001/0009510 A1 | 7/2001 | Lodhie |
| 2002/0068201 A1 | 6/2002 | Vaudo et al. |
| 2002/0084748 A1 | 7/2002 | Ayala et al. |
| 2002/0093820 A1 | 7/2002 | Pederson |
| 2002/0123164 A1 | 9/2002 | Slater, Jr. et al. |
| 2002/0172354 A1 | 11/2002 | Nishi |
| 2002/0196638 A1 | 12/2002 | Stephens et al. |
| 2003/0001166 A1 | 1/2003 | Waalib-Singh et al. |
| 2003/0006418 A1 | 1/2003 | Emerson et al. |
| 2003/0038295 A1 | 2/2003 | Koda |
| 2003/0067758 A1 | 4/2003 | Shipman |
| 2003/0111667 A1 | 6/2003 | Schubert |
| 2003/0113108 A1 | 6/2003 | Bittner |
| 2003/0127660 A1 | 7/2003 | Bawendi et al. |
| 2003/0128341 A1 | 7/2003 | Li |
| 2003/0153861 A1 | 8/2003 | Royer |
| 2003/0165061 A1 | 9/2003 | Martineau |
| 2003/0173575 A1 | 9/2003 | Eisert et al. |
| 2003/0230751 A1 | 12/2003 | Harada |
| 2004/0007961 A1 | 1/2004 | Srivastava et al. |
| 2004/0041220 A1 * | 3/2004 | Kwak et al. ................... 257/432 |
| 2004/0041222 A1 | 3/2004 | Loh |
| 2004/0056260 A1 | 3/2004 | Slater, Jr. et al. |
| 2004/0095763 A1 | 5/2004 | Guerrieri et al. |
| 2004/0184270 A1 | 9/2004 | Halter |
| 2004/0217692 A1 * | 11/2004 | Cho et al. ..................... 313/503 |
| 2004/0218391 A1 | 11/2004 | Procter |
| 2004/0223223 A1 | 11/2004 | Lee |
| 2004/0252502 A1 | 12/2004 | McCullough et al. |
| 2005/0057145 A1 * | 3/2005 | Shieh et al. ................... 313/503 |
| 2005/0094401 A1 | 5/2005 | Magarill |
| 2005/0105301 A1 | 5/2005 | Takeda et al. |
| 2005/0117334 A1 | 6/2005 | Lee et al. |
| 2005/0128744 A1 | 6/2005 | You et al. |
| 2005/0151138 A1 | 7/2005 | Slater et al. |
| 2005/0190559 A1 | 9/2005 | Kragl |
| 2005/0215000 A1 | 9/2005 | Negley |
| 2005/0227379 A1 | 10/2005 | Donofrio |
| 2005/0231953 A1 | 10/2005 | Reeh et al. |
| 2005/0236628 A1 | 10/2005 | Matsuura |
| 2005/0248958 A1 | 11/2005 | Li |
| 2006/0002141 A1 | 1/2006 | Ouderkirk et al. |
| 2006/0006402 A1 | 1/2006 | Hsieh et al. |
| 2006/0012298 A1 | 1/2006 | Lee et al. |
| 2006/0028122 A1 | 2/2006 | Wang et al. |
| 2006/0034084 A1 | 2/2006 | Matsuura et al. |
| 2006/0056169 A1 | 3/2006 | Lodhie et al. |
| 2006/0061259 A1 | 3/2006 | Negley |
| 2006/0061988 A1 | 3/2006 | Johnson et al. |
| 2006/0063289 A1 | 3/2006 | Negley et al. |
| 2006/0066210 A1 * | 3/2006 | Ng et al. ....................... 313/512 |
| 2006/0092643 A1 | 5/2006 | Wong et al. |
| 2006/0104060 A1 | 5/2006 | Kragl |
| 2006/0145172 A1 | 7/2006 | Su et al. |
| 2006/0181879 A1 | 8/2006 | Pederson |

| | | | |
|---|---|---|---|
| 2006/0209558 A1 | 9/2006 | Chinniah et al. | |
| 2007/0012928 A1 | 1/2007 | Peng et al. | |
| 2007/0024191 A1 | 2/2007 | Chen et al. | |
| 2007/0139920 A1 | 6/2007 | Van de Ven et al. | |
| 2007/0139923 A1 | 6/2007 | Negley et al. | |
| 2007/0170447 A1 | 7/2007 | Negley et al. | |
| 2007/0267983 A1 | 11/2007 | Van de Ven et al. | |
| 2007/0278503 A1 | 12/2007 | Van de Ven et al. | |
| 2007/0278934 A1 | 12/2007 | Van de Ven et al. | |
| 2007/0297179 A1 | 12/2007 | Leung et al. | |
| 2008/0030993 A1 | 2/2008 | Narendran et al. | |
| 2008/0054281 A1 | 3/2008 | Narendran et al. | |
| 2008/0084685 A1 | 4/2008 | Van de Ven et al. | |
| 2008/0084701 A1 | 4/2008 | Van de Ven et al. | |
| 2008/0088248 A1 | 4/2008 | Myers | |
| 2008/0089053 A1 | 4/2008 | Negley | |
| 2008/0094829 A1 | 4/2008 | Narendran et al. | |
| 2008/0105887 A1 | 5/2008 | Narendran et al. | |
| 2008/0112168 A1 | 5/2008 | Pickard et al. | |
| 2008/0112170 A1 | 5/2008 | Trott et al. | |
| 2008/0117500 A1 | 5/2008 | Narendran et al. | |
| 2008/0130285 A1 | 6/2008 | Negley et al. | |
| 2008/0179602 A1 | 7/2008 | Negley et al. | |
| 2008/0198572 A1 | 8/2008 | Medendorp | |
| 2008/0259589 A1 | 10/2008 | Van de Ven | |
| 2008/0310154 A1 | 12/2008 | Van de Ven et al. | |
| 2009/0184616 A1 | 7/2009 | Van de Ven et al. | |
| 2009/0195730 A1 | 8/2009 | Park et al. | |
| 2010/0020532 A1 | 1/2010 | Negley | |
| 2010/0155763 A1 | 6/2010 | Donofrio et al. | |
| 2010/0254130 A1 | 10/2010 | Van de Ven et al. | |
| 2010/0290221 A1 | 11/2010 | Tarsa et al. | |
| 2010/0301360 A1 | 12/2010 | Van de Ven et al. | |
| 2010/0314996 A1 | 12/2010 | Van de Ven et al. | |
| 2011/0019399 A1 | 1/2011 | Van de Ven et al. | |

FOREIGN PATENT DOCUMENTS

| | | | |
|---|---|---|---|
| EP | 1 253 373 | | 10/2002 |
| EP | 1 566 848 | | 8/2005 |
| JP | 5-152609 | A | 6/1993 |
| JP | 6-151974 | A | 5/1994 |
| JP | 6-177429 | A | 6/1994 |
| JP | 6-244458 | A | 9/1994 |
| JP | 8-162676 | A | 6/1996 |
| JP | 9-246603 | A | 9/1997 |
| JP | 10-242513 | A | 9/1998 |
| JP | 11-261114 | A | 9/1999 |
| JP | 11-298047 | A | 10/1999 |
| JP | 2000031531 A * | | 1/2000 |
| JP | 2000-101147 | A | 4/2000 |
| JP | 2000-174347 | A | 6/2000 |
| JP | 2000-183405 | A | 6/2000 |
| JP | 2000-286455 | A | 10/2000 |
| JP | 2000-286458 | A | 10/2000 |
| JP | 2001-053341 | A | 2/2001 |
| JP | 2001-077427 | A | 3/2001 |
| JP | 2001-077433 | A | 3/2001 |
| JP | 2001-144334 | A | 5/2001 |
| JP | 2001-230453 | A | 8/2001 |
| JP | 2002-118293 | A | 4/2002 |
| JP | 2002-133938 | | 5/2002 |
| JP | 2002-158378 | A | 5/2002 |
| JP | 2002-223004 | A | 8/2002 |
| JP | 2002-280616 | A | 9/2002 |
| JP | 2003-017755 | A | 1/2003 |
| JP | 2004-056075 | A | 2/2004 |
| JP | 2004-191718 | A | 7/2004 |
| JP | 2005-008844 | A | 1/2005 |
| JP | 2005-277127 | A | 10/2005 |
| JP | 2007035885 A * | | 2/2007 |
| JP | 2008071806 A * | | 3/2008 |
| JP | 2009-267039 | A | 11/2009 |
| WO | WO 97/24706 | A2 | 7/1997 |
| WO | WO 01/61764 | A1 | 8/2001 |
| WO | WO 02/059982 | A1 | 8/2002 |
| WO | WO 2004/068597 | A2 | 8/2004 |
| WO | WO 2004/100226 | A2 | 11/2004 |
| WO | WO 2005/055328 | | 6/2005 |
| WO | WO 2005/078338 | | 8/2005 |
| WO | WO 2005/104253 | A1 | 11/2005 |
| WO | WO 2006/039017 | | 4/2006 |
| WO | WO 2006/061728 | | 6/2006 |
| WO | WO 2007/002234 | A1 | 1/2007 |
| WO | WO 2010/106504 | A1 | 9/2010 |

OTHER PUBLICATIONS

"An Even Brighter Idea", Economist.com, (Technology Quarterly: Q3 2006), 7 pages, retrieved from the Internet on Mar. 5, 2012 http://www.economist.com/node/7904236/print?story_id=7904236.

"High Efficiency, Nitride-Based, Solid-State Lighting", Summary of UCSB Research, Summary of LRC Research, pp. 1-2; http://www.lrc.rpi.edu/programs/solidstate/cr_nitridebasedssl.asp Last Download: Sep. 24, 2011.

Boehlen et al., "Laser micro-machining of high density optical structures on large substrates," Proc. of SPIE, vol. 5339, 2004, pp. 118-126.

Craford, *Overview of Device Issues in High-Brightness Light-Emitting Diodes*, Chapter, *High Brightness Light Emitting Diodes: Semiconductors and Semimetals*, vol. 48, Stringfellow et al. ed., Academic Press, 1997, pp. 47-63.

Kim et al. "Strongly Enhanced Phosphor Efficiency in GaInN White Light-Emitting Diodes Using Remote Phosphor Configuration and Diffuse Reflector Cup" *Japanese Journal of Applied Physics* 44(21):L649-L651 (2005).

LEDs Magazine, "Remote Phosphor Technique Improves White LED output", Apr. 14, 2005, 1 page http://www.ledsmagazine.com/news/2/4/22.

Narendran et al., "Extracting phosphor-scattered photons to improve white LED efficiency", Wiley InterScience, Journals: Rapid Research Letter, Physica Status Solidi(a) Abstract, 2 pages (Mar. 17, 2005); http://www3.interscience.wiley.com/journal/110437401/abstract, Last Download: Sep. 24, 2011.

Narendran et al., "Improving the performance of mixed-color white LED systems by using scattered photon extraction technique", International Society for Optical Engineering, Seventh International Conference on Solid State Lighting, Proceedings of SPIE 6669: 666905 (2007).

Narendran, "Improved Performance White LED, Nov. 2005", Society of Photo-Optical Instrumentation Engineers, Fifth International Conference on Solid State Lighting, Proceedings of SPIE 5941, pp. 1-7 (2005).

Nichia, White LED, Part Nos. NSPW300BS, "Specifications for Nichia White LED, Model NSPW300BS", Retrieved from the internet on Mar. 5, 2012, http://www.led-eshop.de/PDF/3mm/NSPW300BS.pdf.

Nichia, White LED, Part Nos. NSPW312BS, "Specifications for Nichia White LED, Model NSPW312BS", Retrieved from the internet on Mar. 5, 2012, http://www.led-shop24.de/media/docs/nichia_nspw312bs.pdf.

Zhu et al., "Optimizing the Performance of Remote Phosphor LED", First International Conference on White LED's and Solid State Lighting (White LEDs-07) Tokyo, Japan, 5 pages, (Nov. 26-30, 2007).

Invitation to Pay Additional Fees Corresponding to International Application No. PCT/US2012/036761; Date of Mailing: Feb. 27, 2013; 7 Pages.

* cited by examiner

FIG. 7A (300)
- YELLOW LUMIPHOR 306
- CYAN LUMIPHOR 304
- BLUE LED 302

FIG. 7B (310)
- YELLOW LUMIPHOR 316
- RED LUMIPHOR 314
- BLUE LED 312

FIG. 7C (320)
- YELLOW LUMIPHOR 330
- CYAN LUMIPHOR 324 / BLUE LED 322
- RED LUMIPHOR 328 / BLUE LED 326

FIG. 7D (340)
- GREEN LUMIPHOR 346
- CYAN LUMIPHOR 344
- BLUE LED 342

FIG. 7E (350)
- GREEN LUMIPHOR 356
- RED LUMIPHOR 354
- BLUE LED 352

```
┌─────────────────────────────────────────────────┐
│          GREEN LUMIPHOR                         │
│               370                               │
└─────────────────────────────────────────────────┘
┌──────────────────┐              ┌──────────────────┐
│  CYAN LUMIPHOR   │              │   RED LUMIPHOR   │     360
│       364        │              │       368        │
├──────────────────┤              ├──────────────────┤
│     BLUE LED     │              │     BLUE LED     │
│       362        │              │       366        │
└──────────────────┘              └──────────────────┘
```

FIG. 7F

```
┌─────────────────────────────────────────────────────────────┐
│                    YELLOW LUMIPHOR                          │
│                         394                                 │
└─────────────────────────────────────────────────────────────┘
┌──────────────┐      ┌──────────────┐      ┌──────────────┐
│ CYAN LUMIPHOR│      │ RED LUMIPHOR │      │GREEN LUMIPHOR│    380
│     384      │      │     388      │      │     392      │
├──────────────┤      ├──────────────┤      ├──────────────┤
│   BLUE LED   │      │   BLUE LED   │      │   BLUE LED   │
│     382      │      │     386      │      │     390      │
└──────────────┘      └──────────────┘      └──────────────┘
```

FIG. 7G

```
┌─────────────────────────────────────────────────────────────┐
│                    GREEN LUMIPHOR                           │
│                         414                                 │
└─────────────────────────────────────────────────────────────┘
┌──────────────┐      ┌──────────────┐      ┌──────────────┐
│ CYAN LUMIPHOR│      │ RED LUMIPHOR │      │YELLOW LUMIPHOR│   400
│     404      │      │     408      │      │     412      │
├──────────────┤      ├──────────────┤      ├──────────────┤
│   BLUE LED   │      │   BLUE LED   │      │   BLUE LED   │
│     402      │      │     406      │      │     410      │
└──────────────┘      └──────────────┘      └──────────────┘
```

| YELLOW LUMIPHOR 426 | |
|---|---|
| CYAN LUMIPHOR 424 | |
| BLUE LED 422 | RED LED 428 |

| GREEN LUMIPHOR 436 | |
|---|---|
| CYAN LUMIPHOR 434 | |
| BLUE LED 432 | RED LED 438 |

| YELLOW LUMIPHOR 450 | | |
|---|---|---|
| CYAN LUMIPHOR 444 | GREEN LUMIPHOR 448 | |
| BLUE LED 442 | BLUE LED 446 | RED LED 452 |

| GREEN LUMIPHOR 470 | | |
|---|---|---|
| CYAN LUMIPHOR 464 | YELLOW LUMIPHOR 468 | |
| BLUE LED 362 | BLUE LED 466 | RED LED 472 |

FIG. 7L

LIGHTING DEVICES HAVING REMOTE LUMIPHORS THAT ARE EXCITED BY LUMIPHOR-CONVERTED SEMICONDUCTOR EXCITATION SOURCES

CROSS REFERENCE TO RELATED APPLICATIONS

The present application claims priority as a continuation-in-part from U.S. patent application Ser. No. 11/624,811, filed Jan. 19, 2007 now U.S. Pat. No. 8,264,138, which, in turn, claims priority from U.S. Provisional Patent Application Ser. No. 60/760,455, filed Jan. 20, 2006, U.S. Provisional Patent Application Ser. No. 60/761,310, filed Jan. 23, 2006 and from U.S. Provisional Patent Application Ser. No. 60/794,379, filed Apr. 24, 2006. The entire contents of each of the above applications is incorporated herein by reference as if set forth fully herein.

BACKGROUND

The present invention relates to lighting devices and, more particularly, to lighting devices that include a semiconductor light emitting device and a lumiphor for up-converting and/or down-converting radiation emitted by the semiconductor light emitting device.

A wide variety of lighting devices are known in the art including, for example, incandescent light bulbs, fluorescent lights and semiconductor light emitting devices such as light emitting diodes ("LEDs"). LEDs have the potential to exhibit very high efficiencies relative to conventional incandescent or fluorescent lights. However, significant challenges remain in providing LED-based lighting devices that simultaneously achieve high efficiencies, high luminous flux, good color reproduction and acceptable color stability.

LEDs generally include a series of semiconductor layers that may be epitaxially grown on a substrate such as, for example, a sapphire, silicon, silicon carbide, gallium nitride or gallium arsenide substrate. One or more semiconductor p-n junctions are formed in these epitaxial layers. When a sufficient voltage is applied across the p-n junction, electrons in the n-type semiconductor layers and holes in the p-type semiconductor layers flow toward the p-n junction. As the electrons and holes flow toward each other, some of the electrons will recombine with corresponding holes and, each time this occurs, a photon of light is emitted, which is how LEDs generate light. The wavelength distribution of the light generated by an LED generally depends on the semiconductor materials used and the structure of the thin epitaxial layers that make up the "active region" of the device (i.e., the area where the light is generated).

Most LEDs are nearly monochromatic light sources that appear to emit light having a single color. Thus, the spectral power distribution of the light emitted by most LEDs is centered about a "peak" wavelength, which is the wavelength where the spectral power distribution or "emission spectrum" of the LED reaches its maximum as detected by a photo-detector. The "width" of the spectral power distribution of most LEDs is between about 10 nm and 30 nm, where the width is measured at half the maximum illumination on each side of the emission spectrum (this width is referred to as the full-width-half-maximum or "FWHM" width). LEDs are often identified by their "peak" wavelength or, alternatively, by their "dominant" wavelength. The dominant wavelength of an LED is the wavelength of monochromatic light that has the same apparent color as the light emitted by the LED as perceived by the human eye. Because the human eye does not perceive all wavelengths equally (it perceives yellow and green better than red and blue), and because the light emitted by LEDs extends across a range of wavelengths, the color perceived (i.e., the dominant wavelength) may differ from the peak wavelength.

In order to use LEDs to generate white light, LED lighting devices have been provided that include several LEDs that each emit light of a different color. The different colors combine to produce a desired intensity and/or color of white light. For example, by simultaneously energizing red, green and blue LEDs, the resulting combined light may appear white, or nearly white, depending on, for example, the relative intensities, peak wavelengths and spectral power distributions of the source red, green and blue LEDs.

White light may also be produced by partially or fully surrounding a blue, purple or ultraviolet LED with one or more luminescent materials such as phosphors that convert some of the light emitted by the LED to light of one or more other colors. The combination of the light emitted by the LED that is not converted by the luminescent material(s) and the light of other colors that are emitted by the luminescent material(s) may produce a white or near-white light.

As one example, a white-light emitting lighting device may be formed by coating a gallium nitride based, blue light emitting LED with a yellow light emitting luminescent material such as a cerium-doped yttrium aluminum garnet phosphor (which has the chemical formula $Y_3Al_5O_{12}$:Ce, and is commonly referred to as YAG:Ce). The blue LED produces an emission with a peak wavelength of, for example, about 460 nm. Some of blue light emitted by the LED passes between and/or through the YAG:Ce phosphor particles without being affected by the phosphor particles, while other of the blue light emitted by the LED is absorbed by the YAG:Ce phosphor, which becomes excited and emits yellow fluorescence with a peak wavelength of about 550 nm (i.e., the blue light is "down-converted" to yellow light). A viewer will perceive the combination of blue light and yellow light that is emitted by the coated LED as white light. This light is typically perceived as being cool white in color, as it includes a greater percentage of blue light which is in the lower half (shorter wavelength side) of the visible emission spectrum. To make the emitted white light appear more "warm" and/or exhibit better color rendering properties, red-light emitting luminescent materials such as $CaAlSiN_3$ based phosphor particles may be added to the coating. Alternatively, the cool white emissions from the combination of the blue LED and the YAG:Ce phosphor may be supplemented with a red LED (e.g., an AlInGaP-based LED having a dominant wavelength of approximately 619 nm) to provide warmer white light, as is described in U.S. Patent Application Publication No. 2007/0170447.

Phosphors are a luminescent material that is widely used to convert single-color (typically blue or violet) LEDs into white LEDs. Herein, the term "phosphor" may refer to any material that absorbs light at one wavelength and re-emits light at a different wavelength in the visible or ultra violet spectrum, regardless of the delay between absorption and re-emission and regardless of the wavelengths involved. Thus, the term "phosphor" encompasses materials that are sometimes called fluorescent and/or phosphorescent. In general, phosphors may absorb light having emissions in a first wavelength distribution and re-emit light having emissions in a second wavelength distribution that is different from the first wavelength distribution. For example, "down-conversion" phosphors may absorb light having shorter wavelengths and re-emit light having longer wavelengths. In addition to phosphors, other luminescent materials include scintillators, day glow tapes, nanophosphors, quantum dots, and inks that glow in the visible spectrum upon illumination with (e.g., ultraviolet) light.

A medium that includes one or more luminescent materials that is positioned to receive light that is emitted by an LED or other semiconductor light emitting device is referred to herein as a "lumiphor." With respect to LEDs, exemplary lumiphors include layers or "globs" that contain luminescent materials that are (1) coated or sprayed directly onto the LED, (2) coated or sprayed onto surfaces of a lens or other elements of the packaging of the LED, and/or (3) included within clear encapsulants (e.g., epoxy-based or silicone-based curable resin or glass or ceramic) that are positioned on or over the LED. A lumiphor may include one or multiple types of luminescent materials. Other materials may also be included within a lumiphor such as, for example, fillers, diffusants, colorants, or other materials that may improve the performance or cost of the material. If multiple types of luminescent materials are provided in a lumiphor, they may, for example, be mixed together in a single layer or deposited sequentially in successive layers.

SUMMARY

Pursuant to some embodiments of the present invention, lighting devices are provided that include a semiconductor light emitting device and first and second spaced-apart lumiphors. The first lumiphor has a first surface that is positioned to receive radiation emitted by the semiconductor light emitting device and a second surface opposite the first surface. The second lumiphor has a first surface that is positioned to receive radiation emitted by the semiconductor light emitting device and radiation emitted by the luminescent materials in the first lumiphor. The first lumiphor is a leaky lumiphor in that the luminescent materials therein convert less than 90% of the radiation from the semiconductor light emitting device light that is incident on the first lumiphor. In other embodiments, the first lumiphor may convert less than 75% of the radiation from the semiconductor light emitting device light that is incident on the first lumiphor. In still other embodiments, the first lumiphor may convert less than 50% of the radiation from the semiconductor light emitting device light that is incident on the first lumiphor. In some embodiments, a surface area of a lower surface of the second lumiphor that is opposite an upper surface of the first lumiphor may be at least a factor of twenty larger than the upper surface of the first lumiphor.

In some embodiments, the light emitting device may be a blue LED that emits light having a peak wavelength between 400 and 489 nm, and the second lumiphor may include luminescent materials that emit light having a peak wavelength between 510 and 599 nm. The luminescent materials in the first lumiphor may emit light having a peak wavelength between 490 and 515 nm or, alternatively, may emit light having a dominant wavelength of at least 600 nm. In some embodiments, the first lumiphor may be coated directly onto the blue LED. The device may also include a red LED that emits saturated radiation having a dominant wavelength of at least 600 nm.

In some embodiments, the ratio of the average particle size of the luminescent materials in the first and second lumiphors may be at least 4:1. The combination of the blue light emitted by the blue LED and the light emitted by the luminescent materials in the second lumiphor may have a color point that falls (1) within the region on the 1931 CIE Chromaticity Diagram defined by x, y chromaticity coordinates (0.32, 0.40), (0.36, 0.48), (0.43 0.45), (0.36, 0.38), (0.32, 0.40) or (2) within the region on the 1931 CIE Chromaticity Diagram defined by x, y chromaticity coordinates (0.35, 0.48), (0.26, 0.50), (0.13 0.26), (0.15, 0.20), (0.26, 0.28), (0.35, 0.48). The lighting device may emit a warm white light having a correlated color temperature between about 2500K and about 4100K and a CRI Ra value of at least 90.

In some embodiments, the device may include a second blue LED that emits radiation having a peak wavelength between 400 and 489 nm, a third lumiphor that includes different luminescent materials than the luminescent materials that are included in the first and second lumiphors, the third lumiphor having a first surface that is positioned to receive radiation emitted by the second blue LED. In such embodiments, the second lumiphor may be positioned to receive radiation emitted by the second blue LED and may be spaced-apart from the third lumiphor. The luminescent materials in the first lumiphor may emit light having a peak wavelength between 490 and 515 nm, the luminescent materials in the second lumiphor may emit light having a peak wavelength between 540 and 590 nm, and the luminescent materials in the third lumiphor may emit light having a dominant wavelength of at least 600 nm.

Pursuant to further embodiments of the present invention, lighting devices are provided that include a blue LED that emits light having a peak wavelength between 400 and 489 nm and first and second spaced-apart lumiphors. The first lumiphor is positioned adjacent to the blue LED and includes luminescent materials that emit light having a peak wavelength between 490 and 515 nm and/or luminescent materials that emit light having a dominant wavelength of at least 600 nm. The second lumiphor is positioned to receive radiation emitted by the blue LED and includes luminescent materials that emit light having a peak wavelength between 530 and 599 nm.

In some embodiments, the first lumiphor includes luminescent materials that emit light having a dominant wavelength of at least 600 nm. In other embodiments, the first lumiphor includes luminescent materials that emit light having a peak wavelength between 490 and 515 nm. The lighting device may also include a red LED that emits saturated radiation having a dominant wavelength of at least 600 nm. The ratio of the average particle size of the luminescent materials in the first and second lumiphors may be at least 4:1. The surface area of a lower surface of the second lumiphor that is opposite an upper surface of the first lumiphor may be at least a factor of twenty larger than the upper surface of the first lumiphor.

Pursuant to additional embodiments of the present invention, lighting devices are provided that include a plurality of semiconductor light emitting devices, at least some of which devices include a respective associated first lumiphor that has a first surface that is positioned to receive radiation emitted by its associated semiconductor light emitting device. These lighting devices also include a different second lumiphor that is positioned to receive radiation emitted by the semiconductor light emitting devices and that is spaced-apart from the first lumiphors. The ratio of average particle size of the luminescent materials in at least one of the first lumiphors to average particle size of the luminescent materials in the second lumiphor is at least 4:1.

In some embodiments, at least one of the semiconductor light emitting devices is a blue LED that emits light having a peak wavelength between 400 and 489 nm, and the second lumiphor includes luminescent materials that emits light having a peak wavelength between 540 and 599 nm. At least one of the first lumiphors may include luminescent materials that emit light having a peak wavelength between 490 and 515 nm or light having a dominant wavelength of at least 600 nm.

Pursuant to yet additional embodiments of the present invention, lighting devices are provided that include a semiconductor light emitting device, a first lumiphor that is positioned to receive radiation emitted by the semiconductor light emitting device and a second lumiphor that is positioned to receive radiation emitted by the semiconductor light emitting device and radiation emitted by the first lumiphor, the second lumiphor being spaced-apart from the first lumiphor and from the semiconductor light emitting device. A surface area of the second lumiphor is at least a factor of ten times larger than a surface area of the semiconductor light emitting device.

In some embodiments, the first lumiphor may include luminescent materials that emit light having a dominant wavelength of at least 600 nm or having a peak wavelength between 490 and 515 nm, and the second lumiphor may include luminescent materials that emit light having a peak wavelength between 540 and 599 nm. These devices may also include one or more red LEDs that emits saturated radiation having a dominant wavelength of at least 600 nm.

DETAILED DESCRIPTION

Figure 1:
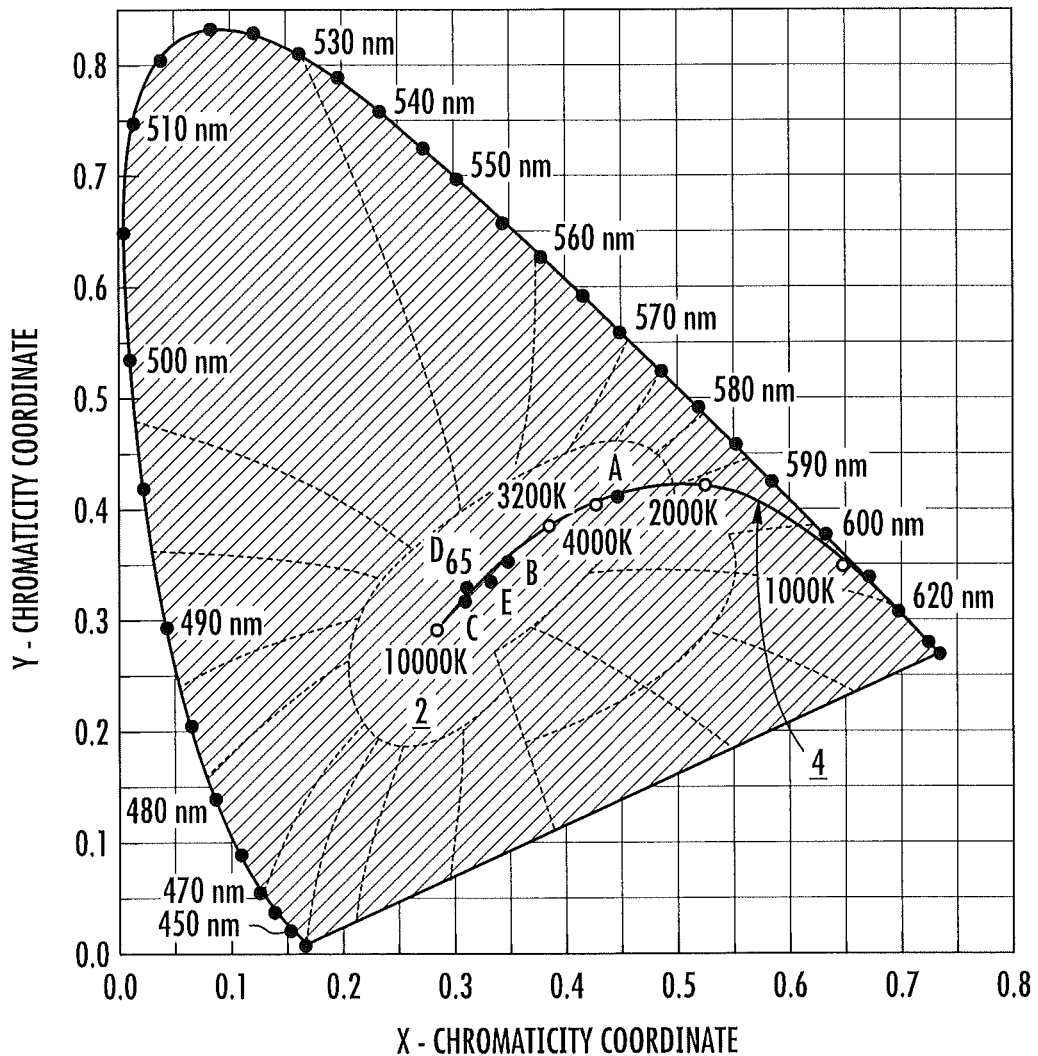
FIG. 1 is a graph of a 1931 CIE Chromaticity Diagram illustrating the location of the black-body locus.

Embodiments of the present invention are directed to lighting devices that include at least one semiconductor light emitting device such as an LED and first and second lumiphors. The first lumiphor may be a "local" lumiphor that is applied (e.g., coated, sprayed, etc.) directly onto the LED or otherwise located closely adjacent to the LED, while the second lumiphor may be a "remote" lumiphor that is spaced apart from both the LED and the first lumiphor. These lighting devices may be designed to emit light that appears white to a human observer. In some embodiments, these lighting devices may be designed to emit warm white light that has good color rendering properties.

In some embodiments, the local lumiphor may comprise a "leaky" lumiphor in that it allows at least 10% of the radiation from an excitation source that is capable of exciting the luminescent materials in the lumiphor to pass through the lumiphor without up-conversion or down-conversion. To provide such a leaky local lumiphor, the local lumiphor may have a low concentration of luminescent materials, luminescent materials having large particle sizes and/or comprise a relatively thin layer. In some embodiments, the leaky local lumiphor may allow a substantial amount of the radiation from the excitation source (e.g., 25% to 75%) passes through the local lumiphor without conversion, and may then be used to excite luminescent materials contained in the remote lumiphor. In some embodiments, the leaky local lumiphor may convert less than 90% of the radiation from the semiconductor light emitting device light that is incident thereon. In other embodiments, the leaky local lumiphor may convert less than 75% of the radiation from the semiconductor light emitting device light that is incident thereon. In still other embodiments, the leaky local lumiphor may convert less than 50% of the radiation from the semiconductor light emitting device light that is incident thereon. The luminescent materials included in the local lumiphor may be selected so that most of the light emitted by the local lumiphor will not excite the luminescent materials included in the remote lumiphor. This can advantageously reduce the number of incidences where light emitted by the LED is down-converted (or up-converted) multiple times, which may improve the efficiency of the lighting device.

In some embodiments, the lighting device can include at least one LED having a local lumiphor that includes luminescent materials that emit light having a peak wavelength in the cyan color range. In other embodiments, the lighting device can include at least one LED having a local lumiphor that includes luminescent materials that emit light having a dominant wavelength in the red color range. In still further embodiments, the lighting device may include a first group of LEDs that include cyan light emitting local lumiphors and a second group of LEDs that include red light emitting local lumiphors. In each of the above embodiments, the remote lumiphor may include luminescent materials that emit light having a peak wavelength in the yellow color range and/or luminescent materials that emit light having a peak wavelength in the green color range. Herein, the yellow color range refers to light having wavelengths between 571 and 599 nm, and the green color range refers to light having wavelengths between 510 and 570 nm.

In some embodiments, the lighting device may include at least one local lumiphor and at least one remote lumiphor, where the ratio of the average particle sizes of the luminescent materials in a first of the local lumiphors to the average particle sizes of the luminescent materials in a first of the remote lumiphors is at least 4:1. In other embodiments, the ratio may be 6:1, 8:1 or even 10:1. Moreover, in some embodiments, the sum of the surface areas of the upper surfaces of all of the local lumiphors may be less than 10% the sum of the surface area of the lower surface of the remote lumiphors.

As used herein, the term "semiconductor light emitting device" refers to LEDs, laser diodes and any other light emitting device that includes one or more semiconductor layers, regardless of whether or not these light emitting devices are combined with packaging elements, lumiphors, light mixing elements, light focusing elements, electrical leads, electrical contacts or other elements that are commonly included in a packaged lighting device. These semiconductor light emitting devices may include, for example, silicon, silicon carbide, gallium nitride, zinc oxide and/or other semiconductor layers, an optional semiconductor or non-semiconductor substrate, and one or more conductive contact layers. The term "light emitting device," as used herein, is not limited, except that it be a device that is capable of emitting light, and the term "lighting device" refers to a device that includes at least one light emitting device.

Semiconductor light emitting devices according to embodiments of the invention may include III-V nitride (e.g., gallium nitride) based LEDs fabricated on a silicon carbide, sapphire, gallium nitride or silicon substrates such as various devices manufactured and/or sold by Cree, Inc. of Durham, N.C. Such LEDs may (or may not) be configured to operate such that light emission occurs through the substrate in a so-called "flip chip" orientation. These LEDs may have a cathode contact on one side of the LED, and an anode contact on an opposite side of the LED, or may alternatively have both contacts on the same side of the device. Some embodiments of the present invention may use semiconductor light emitting devices, device packages, fixtures, luminescent materials, power supplies and/or control elements such as described in U.S. Pat. Nos. 7,564,180; 7,456,499; 7,213,940; 7,095,056; 6,958,497; 6,853,010; 6,791,119; 6,600,175, 6,201,262; 6,187,606; 6,120,600; 5,912,477; 5,739,554; 5,631,190; 5,604,135; 5,523,589; 5,416,342; 5,393,993; 5,359,345; 5,338,944; 5,210,051; 5,027,168; 5,027,168; 4,966,862, and/or 4,918,497, and U.S. Patent Application Publication Nos. 2009/0184616; 2009/0080185; 2009/0050908; 2009/0050907; 2008/0308825; 2008/0198112; 2008/0179611, 2008/0173884, 2008/0121921; 2008/0012036; 2007/0253209; 2007/0223219; 2007/0170447; 2007/0158668; 2007/0139923, and/or 2006/0221272. The design and fabrication of semiconductor light emitting devices are well known to those skilled in the art, and hence further description thereof will be omitted.

As noted above, lighting devices according to embodiments of the present invention may be designed to produce warm white light and/or light having good color rendering properties. Before describing these devices in detail, it is useful to discuss what qualifies as warm white light and good color rendering. In particular, the apparent color of visible light to humans can be illustrated with reference to a two-dimensional chromaticity diagram, such as the 1931 CIE Chromaticity Diagram illustrated in FIG. 1, which defines the different colors of visible light as a weighted sums of colors.

As shown in FIG. 1, colors on a 1931 CIE Chromaticity Diagram are defined by x and y coordinates (i.e., chromaticity coordinates, or color points) that fall within a generally U-shaped area that includes all of the hues perceived by the human eye. Colors on or near the outside of the area are saturated colors composed of light having a single wavelength, or a very small wavelength distribution. Colors on the interior of the area are unsaturated colors that are composed of a mixture of different wavelengths. White light, which can be a mixture of many different wavelengths, is generally found near the middle of the diagram, in the region labeled 2 in FIG. 1. There are many different hues of light that may be considered "white," as evidenced by the size of the region 2. For example, some "white" light, such as light generated by tungsten filament incandescent lighting devices, may appear yellowish in color, while other "white" light, such as light generated by some fluorescent lighting devices, may appear more bluish in color.

Each point in the diagram of FIG. 1 is referred to as the "color point" of a light source that emits a light having that color. As shown in FIG. 1 a locus of color points that is referred to as the "black-body" locus 4 exists which corresponds to the location of color points of light emitted by a black-body radiator that is heated to various temperatures. The black-body locus 4 is also referred to as the "planckian" locus because the chromaticity coordinates (i.e., color points) that lie along the black-body locus obey Planck's equation: $E(\lambda)=A\lambda^{-5}/(e^{B/T}-1)$, where E is the emission intensity, $\lambda$ is the emission wavelength, T is the color temperature of the black-body and A and B are constants. Color coordinates that lie on or near the black-body locus 4 yield pleasing white light to a human observer.

As a heated object becomes incandescent, it first glows reddish, then yellowish, and finally bluish with increasing temperature. This occurs because the wavelength associated with the peak radiation of the black-body radiator becomes progressively shorter with increased temperature, consistent with the Wien Displacement Law. Illuminants that produce light which is on or near the black-body locus 4 can thus be described in terms of their correlated color temperature (CCT). The 1931 CIE Diagram of FIG. 1 includes temperature listings along the black-body locus that show the color path of a black-body radiator that is caused to increase to such temperatures. As used herein, the term "white light" refers to light that is perceived as white, is within 7 MacAdam ellipses of the black-body locus on a 1931 CIE chromaticity diagram, and has a CCT ranging from 2000K to 10,000K. White light with a CCT of 3000K may appear yellowish in color, while white light with a CCT of 8000K or more may appear more bluish in color, and may be referred to as "cool" white light. "Warm" white light may be used to describe white light with a CCT of between about 2500K and 4500K, which is more reddish or yellowish in color. Warm white light is generally a pleasing color to a human observer. Warm white light with a CCT of 2500K to 3300K may be preferred for certain applications.

The ability of a light source to accurately reproduce color in illuminated objects is typically characterized using the color rendering index ("CRI Ra"). The CRI Ra of a light source is a modified average of the relative measurements of how the color rendition of an illumination system compares to that of a reference black-body radiator when illuminating eight reference colors. Thus, the CRI Ra is a relative measure of the shift in surface color of an object when lit by a particular lamp. The CRI Ra equals 100 if the color coordinates of a set of test colors being illuminated by the illumination system are the same as the coordinates of the same test colors being irradiated by the black-body radiator. Daylight generally has a CRI Ra of nearly 100, incandescent bulbs have a CRI Ra of about 95, fluorescent lighting typically has a CRI Ra of about 70 to 85, while monochromatic light sources have a CRI Ra of essentially zero. Light sources for general illumination applications with a CRI Ra of less than 50 are generally considered very poor and are typically only used in applications where economic issues preclude other alternatives. Light sources with a CRI Ra value between 70 and 80 have application for general illumination where the colors of objects are not important. For some general interior illumination, a CRI Ra value of greater than 80 is acceptable. A light source with color coordinates within 4 MacAdam step ellipses of the black-body locus 4 and a CRI Ra value that exceeds 85 is more suitable for general illumination and various other applications, as with these applications it is often desirable to provide a lighting device that generates white light having a relatively high CRI Ra so that objects illuminated by the lighting device may appear to have more natural coloring to the human eye. Light sources with CRI Ra values of more than 90 provide good color quality.

As noted above, various methods are available for using one or more semiconductor light emitting devices to generate warm white light. For example, lighting devices have been provided that include separate red, green and blue semiconductor light emitting devices which, when simultaneously energized, produce a combined light output that may appear white, or nearly white, depending on the relative intensities of the red, green and blue sources. However, the combined light, while appearing white, may have a low CRI Ra value, particularly if the emitters generate saturated light, because such light may lack contributions from many visible wavelengths.

As is also noted above, in another conventional approach, a lighting device that emits relatively warm white light may be formed by combining (1) a blue-light emitting LED that is coated with a yellow light emitting lumiphor such as a lumiphor that includes YAG:Ce phosphor particles with (2) a red light emitting AlInGaP LED. A viewer will perceive the combination of the unconverted blue light that passes through the lumiphor, the yellow light emitted by the phosphor in the lumiphor and the red light emitted by the AlInGaP LED as being white light. Such lighting devices, while having high CRI Ra values (typically 85 to 95) and very good efficacy, use LEDs formed in two different material systems (namely both GaN-based blue LEDs and AlInGaP-based red LEDs). Unfortunately, LEDs formed in disparate material systems may react differently under various environmental parameters such as temperature and/or may degrade at different rates over time. As such, lighting devices that use LEDs formed in disparate material systems may require more complex drive circuitry that includes, for example, temperature or usage-based compensation circuitry, which can increase the size, cost and complexity of the lighting device.

A third approach for using semiconductor light emitting devices to generate warm white light is to use one or more LEDs that are from the same material system along with lumiphors that include luminescent materials that emit light in various color ranges across the visible light spectrum. In representative examples of such an approach, a gallium nitride based blue LED may be coated with a lumiphor that includes green light emitting, yellow light emitting and red light emitting luminescent materials or, alternatively, three gallium nitride based LEDs may be provided, each of which is coated with a lumiphor that includes either green light emitting, yellow light emitting or red light emitting luminescent materials, and a diffuser may be provided that mixes the light output by the three LEDs. As such lighting devices only uses gallium nitride based LEDs, the need for temperature or usage-based compensation circuits may be reduced or eliminated.

However, a number of problems may arise with such lighting devices. For example, luminescent materials that are commonly used to convert blue light to red light tend to be leaky (e.g., because the luminescent materials have large particle sizes), and hence a significant amount of the blue light from the LED passes unconverted through such luminescent materials, which can negatively affect both the color temperature and the CRI Ra value of the lighting device. In order to address this problem, the lumiphor including the red light emitting luminescent materials may be coated more thickly onto the blue LED, but this increases material costs, and the thicker lumiphor may generate increased back-scattering of the emitted light and can increase the temperature of the lumiphor in operation, which may necessitate a reduction in the drive current to the LED, and a corresponding decrease in the luminous output thereof. Additionally, when multiple luminescent materials are mixed within the same lumiphor (either in the same layer or in successive layers), the number of multiple conversions increases (i.e., blue light is converted to green light by a first luminescent material, and the generated green light is then converted to yellow or red light by a second luminescent material). As each conversion of a photon has an efficiency loss, an increased number of multiple conversions reduces the luminous output of the lighting device.

Pursuant to embodiments of the present invention, semiconductor light emitting devices are provided that may be designed to emit warm white light and to have high CRI Ra values, including CRI Ra values that can exceed 90. These devices may also exhibit high luminous power output and good efficacy. As discussed above, these lighting devices may achieve this performance by employing both a local lumiphor and a remote lumiphor that is spaced-apart from the local lumiphor, where the output of the local lumiphor is used at least in part to excite the luminescent materials in the remote lumiphor.

Figure 2A:
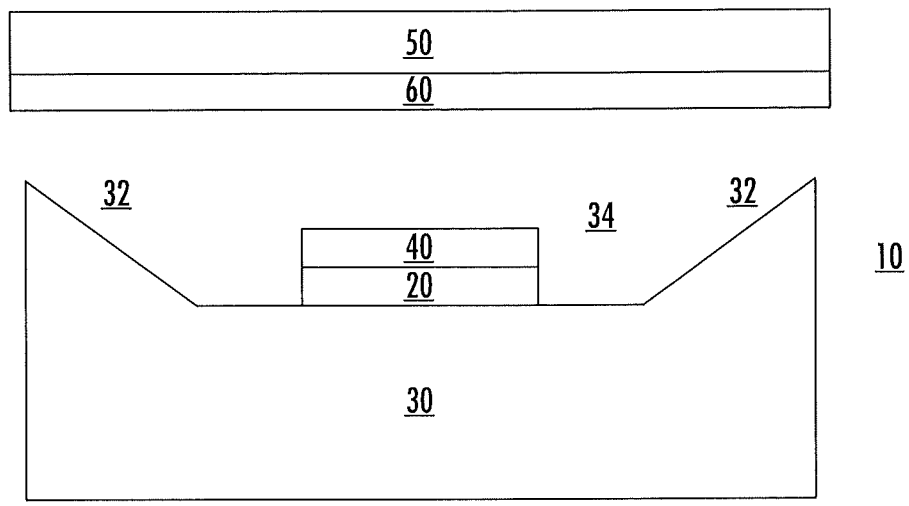
FIGS. 2A-B are schematic cross-sectional and top plan views of a lighting device according to certain embodiments of the present invention
Figure 2B:
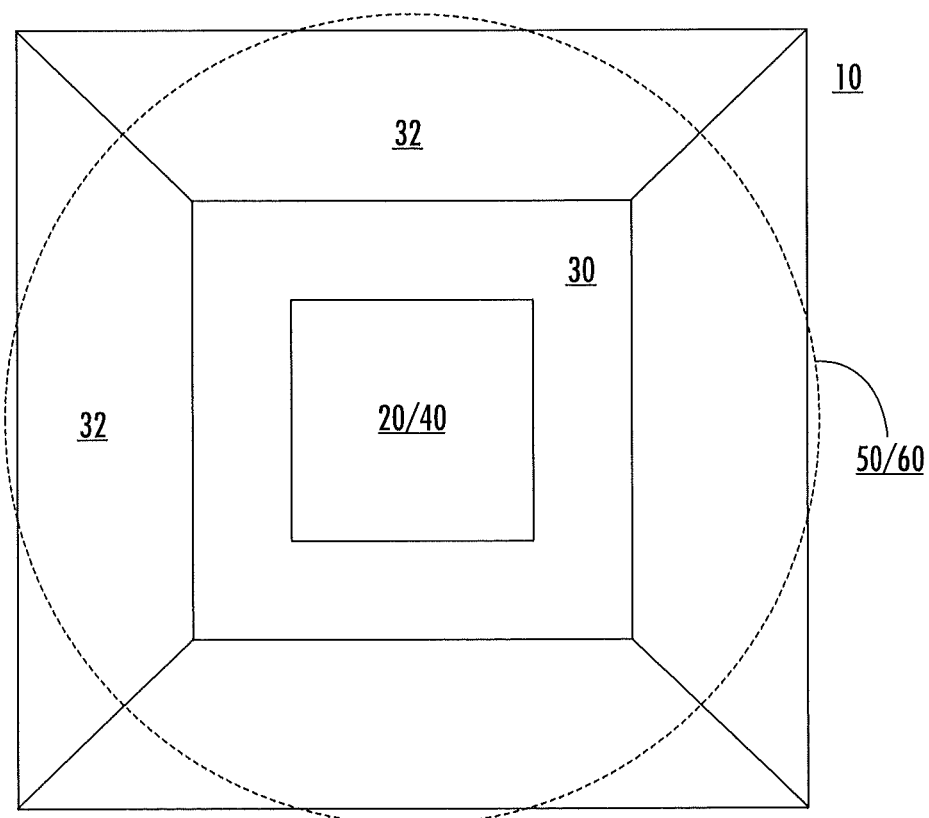
Figure 2C:
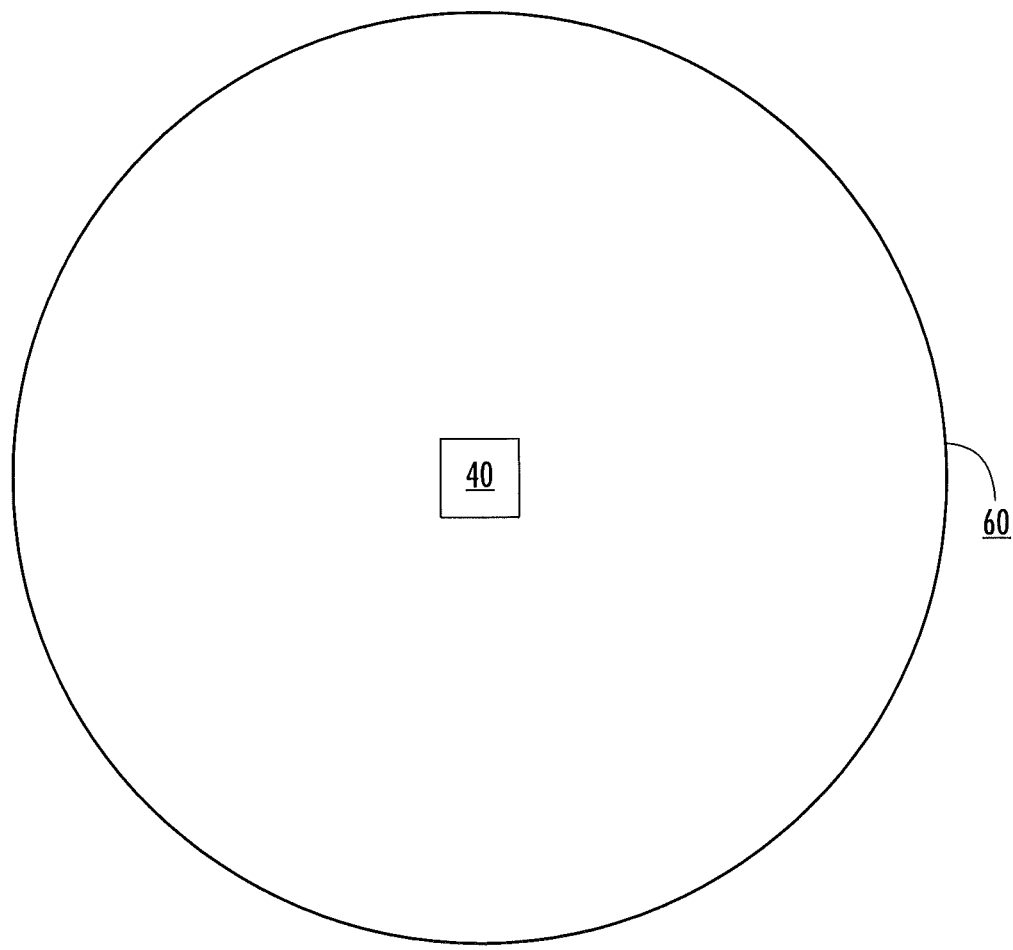
FIG. 2C is a schematic top plan view of a lighting device according to embodiments of the present invention that illustrates that a pair of lumiphors included therein may have disparate surface areas.

FIGS. 2A and 2B are, respectively, schematic cross-sectional and plan views of a lighting device 10 according to certain embodiments of the present invention. FIG. 2C is a schematic plan view of a lighting device according to embodiments of the present invention that illustrates that a pair of lumiphors included therein may have disparate sizes.

As shown in FIGS. 2A-B, the lighting device 10 includes an LED 20 that is mounted in or on a reflective element 30, a local lumiphor 40, a transparent element 50 and a remote lumiphor 60.

The LED 20 may comprise, for example, a gallium nitride based LED that emits light having a peak wavelength in the blue color range, namely between 400 and 490 nm. Electrical connections (not shown) may be made to appropriate surfaces of the LED 20 to provide connections to an external circuit (not shown) that provides a drive current to the LED 20. Appropriate electrical connections are well known in the art, including wire bonds, bond pads, circuit traces, contact pads and the like. The electrical connections can be made to one or both sides of the LED 20 depending upon the orientation of the LED 20 and the locations of the contacts to the p-type and n-type layers thereof. While only a single LED 20 is included in the lighting device 10, in other embodiments, multiple LEDs 20 may be provided. In such embodiments, the multiple LEDs may, for example, be electrically connected in series, in parallel, in a combination of series and parallel connections and/or may be grouped into multiple groups of separately driven LEDs.

The LED 20 may be mounted in or on the reflective element 30. The reflective element 30 may comprise, for example, a cup, a submount, a printed circuit board or any other appropriate mounting element. All or part of an upper surface of the reflective element 30 may comprise a reflective material such as, for example, a reflective metal. The reflective element 30 may include one or more angled sidewalls 32 that facilitate transmitting reflective light out of an optical cavity 34 that is defined, for example, by the sidewalls 32 and upper surface of the reflective element 30.

The local lumiphor 40 may cover an upper surface of the LED 20. In some embodiments, the local lumiphor 40 may also partially or completely cover sidewalls of the LED 20. In some embodiments, the local lumiphor 40 may be applied to the LED 20 by coating, spraying or otherwise applying a medium that includes luminescent materials onto the LED 20. The local lumiphor 40 may, for example, be applied to the LED 20 in liquid form and then cured by heat or some other curing agent to leave a resin layer having luminescent materials therein on the LED 20. The local lumiphor 40 may include, for example, the luminescent materials and one or more binder materials such as silicone or epoxy resins. The local lumiphor 40 may also include other elements such as, for example, diffuser particles (e.g., titanium dioxide particles). Any suitable luminescent materials may be used in the local lumiphor 40.

In some embodiments, the first local lumiphor 40 may include luminescent materials that are excited by the radiation from the blue LED 20 to emit light having a peak wavelength between about 490 and about 515 nm (i.e., in the cyan color range) such as, for example, a phosphor that emits light having a peak wavelength in the cyan color range. The average size of the phosphor particles (or other luminescent materials) in the local lumiphor 40 may be relatively large, such as particles having an average diameter of at least 20 microns (e.g., most particle sizes might have diameters in the range between 25 microns and 40 microns). It will be appreciated that the particles may not be round; the "diameter" of luminescent particles that are not round is considered to be the diameter of a sphere that has the same surface area as the particle. Cyan light emitting phosphor particle having large diameters are available from Intematrix. In some embodiments, the wavelength conversion material that emits cyan light may be quantum dots rather than phosphor particles.

In some embodiments, the local lumiphor 40 may have a thickness of less than about 60 microns. If phosphor particles are used that have an average diameter of between 25 microns and 40 microns, it is apparent that in most places in the local lumiphor 40 there will be only a single phosphor particle for a photon of light to pass through (i.e., multiple photons will not be stacked vertically in the layer as the size of most of the particles will be more than 50% of the thickness of the lumiphor layer 40). As a result, most gaps between adjacent phosphor particles in the local lumiphor 40 provide a transmission path where a photon of light may "leak" through the local lumiphor without contacting a phosphor particle (since, in most places, phosphor particles will not be stacked on top of each other).

In other embodiments, the local lumiphor 40 may include luminescent materials that are excited by the radiation from the blue LED 20 to emit light having a peak wavelength of at least 600 nm such as, for example, a phosphor that emits light having a peak wavelength in the red color range. Suitable luminescent materials for these embodiments may include $Lu_2O_3:Eu^{3+}$ phosphors; $(Sr_{2-x}La_x)(Ce_{1-x}Eu_x)O_4$ phosphors; $Sr_2Ce_{1-x}Eu_xO_4$ phosphors; $Sr_{2-x}Eu_xCeO_4$ phosphors; $SrTiO_3$: $Pr^{3+},Ga^{3+}$ phosphors; $(Ca_{1-x}Sr_x)SiAlN_3:Eu^{2+}$ phosphors; and/or $Sr_2Si_5N_8:Eu^{2+}$ phosphors.

The transparent element 50 may comprise, for example, a transparent disk, a transparent lens or the like that is mounted above the LED 20 and the local lumiphor 40. In some embodiments, The transparent element 50 can have many different shapes such as, for example, hemispheric, ellipsoid bullet, flat, hex-shaped, square, etc. The transparent element 50 can be formed of various materials including, for example, silicones, plastics, epoxies or glass. The transparent element 50 can be textured to improve light extraction, and can be designed to act as a diffuser by mixing light that impinges thereon.

The remote lumiphor 60 may, for example, be coated, sprayed or otherwise applied to a surface of the transparent element 50 (e.g., an inner or outer surface). In some embodiments, the remote lumiphor 60 may be applied to the inner surface of the transparent element 50, and the transparent element 50 may be designed to mix light so that the light exiting the transparent element 50 is a well-mixed mixture of the light emitted by the LED 20, the luminescent materials in the local lumiphor 40 and the luminescent materials in the remote lumiphor 60.

In some embodiments, the remote lumiphor 60 may include luminescent materials that are excited by the radiation from the blue LED 20 to emit light having a peak wavelength between about 571 and about 599 nm such as, for example, a phosphor that emits light having a peak wavelength in the yellow color range. In some embodiments, YAG: Ce phosphor particles may be used. Other suitable yellow light emitting luminescent materials that may be used include, for example, other phosphors based on the $(Gd,Y)_3(Al, Ga)_5O_{12}:Ce$ system; $Tb_{3-x}RE_xO_{12}:Ce$ (TAG) phosphors where RE=Y, Gd, La, Lu; and/or $Sr_{2-x-y}Ba_xCa_ySiO_4:Eu$ phosphors.

In other embodiments, the remote lumiphor 60 may include luminescent materials that are excited by the radiation from the blue LED 20 to emit light having a peak wavelength between about 510 and about 570 nm such as, for example, a phosphor that emits light having a peak wavelength in the green color range. Suitable green light emitting luminescent materials include, for example, LuAG:Ce phosphor particles, $(Sr,Ca,Ba)(Al,Ga)_2S_4:Eu^{2+}$ phosphors; $Ba_2(Mg,Zn)Si_2O_7:Eu^{2+}$ phosphors; $Gd_{0.46}Sr_{0.31}Al_{1.23}O_xF_{1.38}$: $Eu^{2+}_{0.06}$ phosphors; $(Ba_{1-x-y}Sr_xCa_y)SiO_4:Eu$ phosphors; $Ba_xSiO_4:Eu^{2+}$ phosphors; $Sr_6P_5BO_{20}:Eu$ phosphors; $MSi_2O_2N_2:Eu^{2+}$ phosphors; and/or Zinc Sulfide:Ag phosphors with (Zn,Cd)S:Cu:Al.

In still other embodiments, the remote lumiphor 60 may include luminescent materials that are excited by the radiation from the blue LED 20 to emit light having a peak wavelength between about 490 and about 515 nm such as, for example, a phosphor that emits light having a peak wavelength in the cyan color range.

Figure 3:
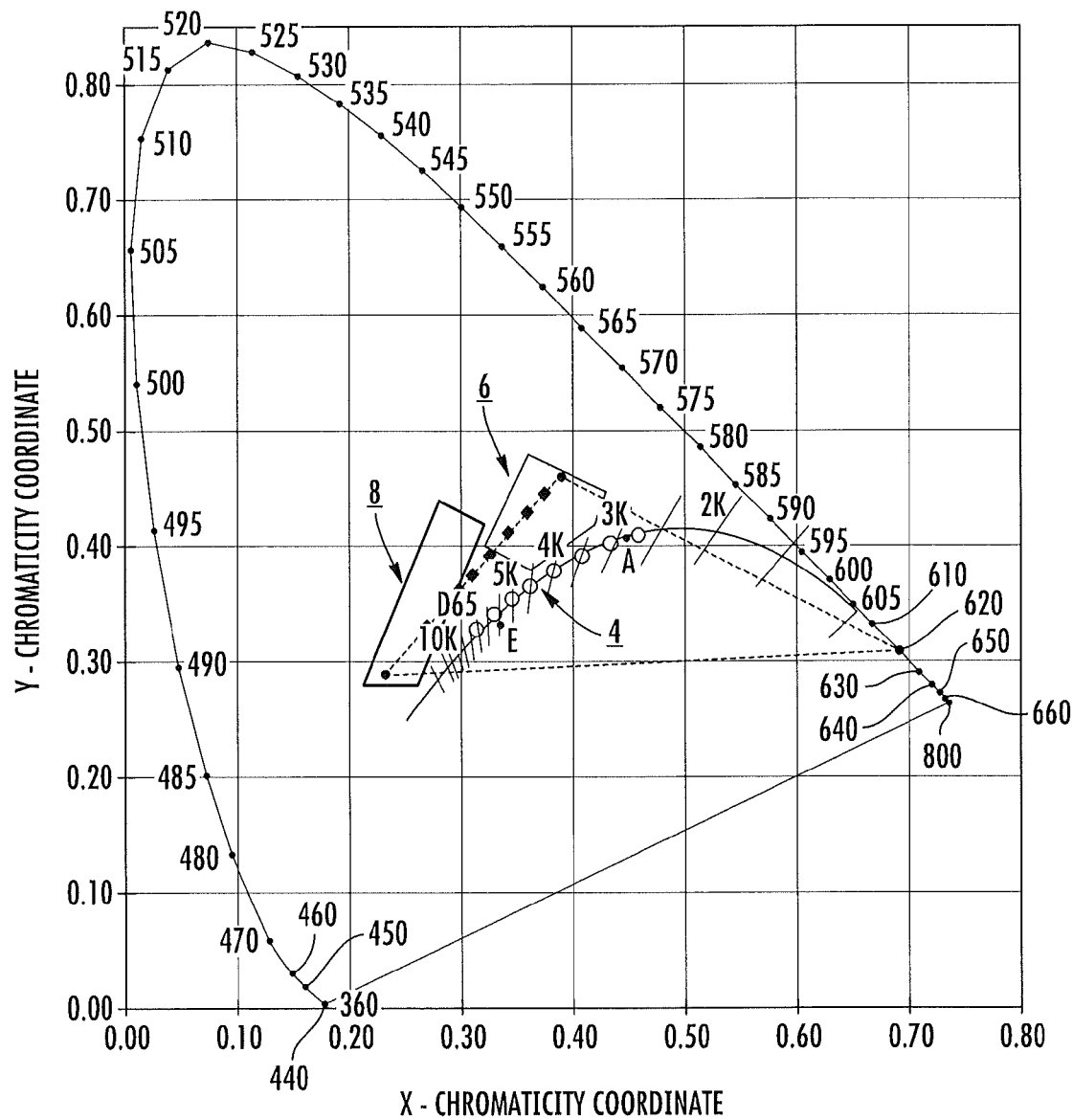
FIG. 3 is another version of the 1931 CIE Chromaticity Diagram that includes trapezoids illustrating color points that may be produced by blue-shifted-yellow and blue-shifted-green LEDs.

In some embodiments, the LED 20 and the remote lumiphor 60 may together comprise a so-called blue-shifted-yellow or "BSY" LED. A "BSY LED" refers to a blue LED and an associated lumiphor that together emit light having a color point that falls within a trapezoidal "BSY region" on the 1931 CIE Chromaticity Diagram defined by the following x, y chromaticity coordinates: (0.32, 0.40), (0.36, 0.48), (0.43 0.45), (0.36, 0.38), (0.32, 0.40), which is generally within the yellow color range. In other embodiments, the LED 20 and the remote lumiphor 60 may together comprise a so-called blue-shifted-green or "BSG" LED. A "BSG LED" refers to a blue LED and an associated lumiphor that together emit light having a color point that falls within a trapezoidal "BSG region" on the 1931 CIE Chromaticity Diagram defined by the following x, y chromaticity coordinates: (0.35, 0.48), (0.26, 0.50), (0.13 0.26), (0.15, 0.20), (0.26, 0.28), (0.35, 0.48), which is generally within the green color range. FIG. 3 is a reproduction of the 1931 CIE Chromaticity Diagram that graphically illustrates the BSY region 6 and the BSG region 8 and shows the locations of the BSY region 6 and the BSG region 8 with respect to the black-body locus 4.

Referring again to FIGS. 2A-B, in some embodiments, the remote lumiphor 60 may include luminescent materials that have typical particle size distributions and an average particle size of, for example, between 2 microns and 6 microns. In some embodiments, the ratio of the average particle size of the luminescent materials in the local lumiphor 40 to the average particle size of the luminescent materials in the remote lumiphor 60 may be at least 4:1. In other embodiments, the ratio of the average particle size of the luminescent materials in the local lumiphor 40 to the average particle size of the luminescent materials in the remote lumiphor 60 may be at least 6:1. In other embodiments, the ratio may be 8:1 or even 10:1. The lighting device 10 may emit a warm white light having a correlated color temperature between about 2500K and about 4100K and a CRI Ra value of at least 90.

The remote lumiphor 60 may be between about 10 microns and about 50 microns thick. In some specific embodiments, the remote lumiphor 60 may be between about 15 microns and about 25 microns thick. Assuming, for example, that the average particle size (diameter) in the remote lumiphor 60 is between 3 microns and 5 microns, then a 20 micron thick lumiphor 60 could have about 4-6 phosphor particles stacked vertically throughout the lumiphor. This stacked arrangement tends to fill in the gaps, and thus the lumiphor may convert a higher percentage of the photons that are incident thereon, since fewer gaps between photons will exist that extend all the way (or most of the way) through the layer.

Referring now to FIGS. 2B and 2C, the surface area of a first surface of the remote lumiphor 60 that faces a first surface of the local lumiphor 40 may be larger than the surface area of the first surface of the local lumiphor 40. As shown in FIG. 2C, in some embodiments, the surface area of the first surface of the remote lumiphor 60 (i.e., the surface area of the lower surface of remote lumiphor 60 may greatly exceed the surface area of the opposed first surface (i.e., the upper surface) of the local lumiphor 40. In some embodiments, the ratio of the surface areas of the facing surfaces of the remote lumiphor 60 and the local lumiphor 40 may exceed 10:1 or even 20:1. In other embodiments, this ratio may exceed 50:1 or even 100:1. As discussed herein, by designing the device 10 to have a remote lumiphor 60 and local lumiphor 40 that have facing surfaces where the surface area of the surface of the remote lumiphor 60 greatly exceeds the surface area of the surface of the local lumiphor 40, the light extraction from the device 10 may be improved in some cases.

Figure 4:
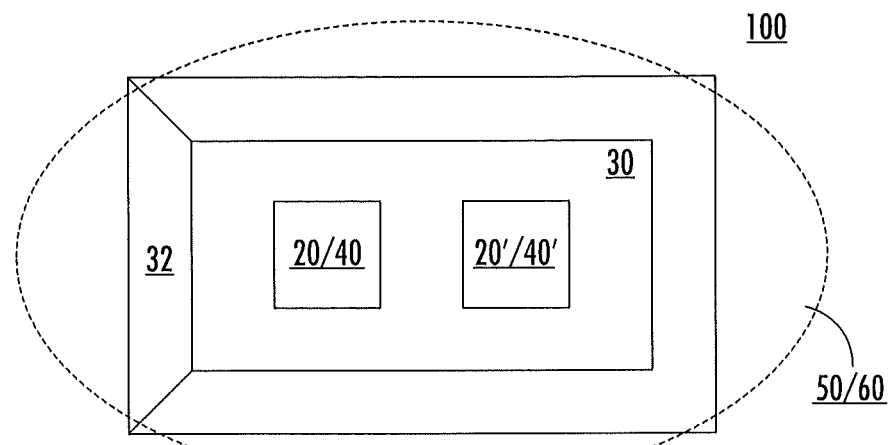
FIG. 4 is a schematic top plan view of a lighting device 100 according to further embodiments of the present invention.

FIG. 4 is a schematic top plan view of a lighting device 100 according to further embodiments of the present invention. As is evident from a comparison of FIGS. 2 and 4, the lighting device 100 may be very similar to the lighting device 10 of FIG. 2, except that in addition to the first LED 20 that has the local lumiphor 40 applied thereon, the lighting device 100 also includes a second LED 20' that has a second local lumiphor 40' applied thereon. Additionally, the shape of the reflective element 30 and the transparent element 50 and remote lumiphor 60 have also been modified in the lighting device 100 to better fit the two LED design of lighting device 100.

In one exemplary embodiment of the lighting device 100 of FIG. 4, the first and second LEDs 20, 20' may each comprise LEDs that emit light having a peak wavelength between 400 and 490 nm, the local lumiphor 40 may include luminescent materials that emit light having a peak wavelength in the cyan color range, and the local lumiphor 40' may include luminescent materials that emit light having a peak wavelength in the red color range. In another exemplary embodiment, the first LED 20 may comprise an LED that emits light having a peak wavelength between 400 and 490 nm, the second LED 20' may comprise an LED that emits nearly saturated light having a peak wavelength of at least 600 nm, the local lumiphor 40 may include luminescent materials that emit light having a peak wavelength in the cyan color range, and the local lumiphor 40' may be omitted. In each of these embodiments, blue light, cyan light and red light are emitted from the combination of the LEDs 20, 20' and the local lumiphors 40, 40'. This light is incident on the remote lumiphor 60. The blue light that passes unconverted through the local lumiphor 40 and the local lumiphor 40' (if provided) excites yellow light or green light emitting luminescent materials in the remote lumiphor 60, to add yellow and or green light to the emission spectra of the device 100.

The lighting devices 10 and 100 described above may exhibit a number of design and/or performance advantages over various prior art lighting devices.

Figure 5:
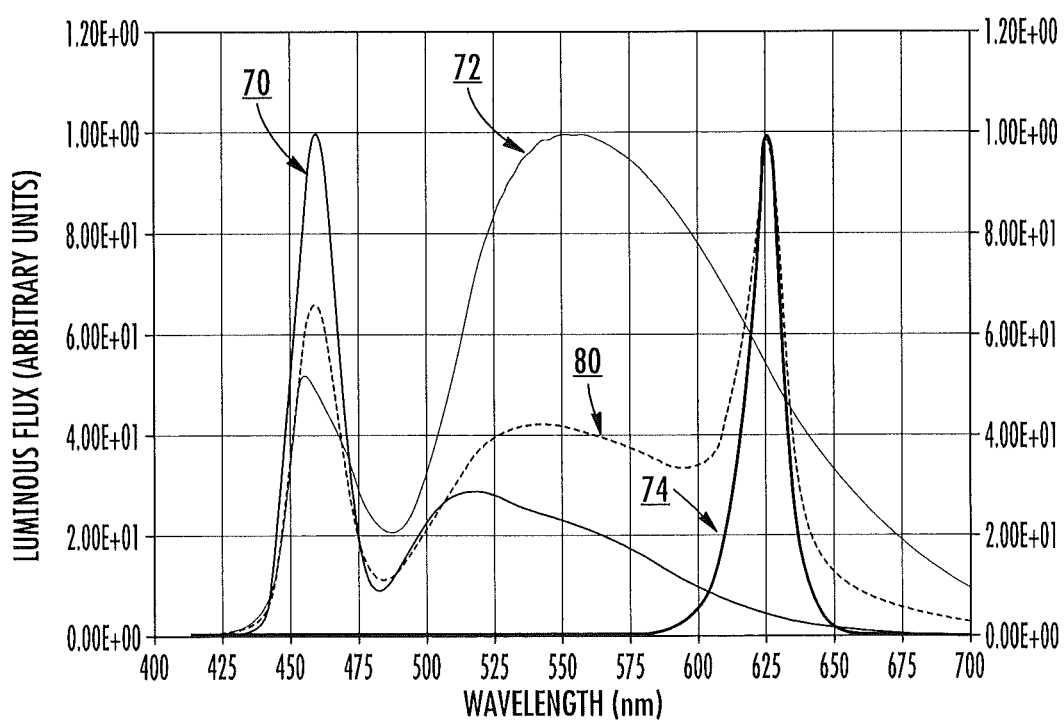
FIG. 5 is a graph of an exemplary emission spectrum for a semiconductor light emitting device that includes a blue LED, a yellow light-emitting phosphor and a red light source.

For example, a lighting device that includes a blue LED, a yellow light emitting phosphor and a red light source (e.g., a red light emitting phosphor or a red LED) may have an emission spectrum similar to the spectrum shown in the graph of FIG. 5. In FIG. 5, the curve labeled 70 represents the emissions from the blue LED that pass unconverted through the yellow light emitting phosphor, the curve labeled 72 represents the emissions from the yellow light emitting phosphor, the curve labeled 74 represents that emissions from the red light source, and the curve labeled 80 represents the total combined emissions of the device. As is apparent from FIG. 5, the resulting emission spectrum (curve 80) may have a noticeable valley in the cyan color range that falls between the blue and green color ranges. As discussed above, according to embodiments of the present invention, the local lumiphor may include luminescent materials that emit light having a peak wavelength in the cyan color range. The light so emitted may help "fill-in" this gap in the emission spectrum, which may improve the CRI Ra value of the lighting device.

As another example, one potential problem with the use of phosphors that emit light having a peak wavelength in the cyan color range is that such phosphors may tend to have large average particle sizes. While larger sized phosphor particles tend to advantageously be more efficient than smaller phosphor particles, lumiphors that include larger phosphor particles also tend to be leaky in that they tend to convert a smaller percentage of the excitation radiation that passes through the lumiphor. As noted above, if, for example, too much blue light escapes through a lumiphor, the output of the lighting device may have "cooler" white light and/or a lower CRI Ra value. However, by providing a remote lumiphor that is excited by blue light that travels without conversion through the local lumiphor, the potential disadvantage of blue light leakage may be avoided. Moreover, the fact that the larger particle sizes in the first local phosphor are more efficient remains as an advantage. Hence, the lighting devices 10 and 100 described above can have improved efficiency. The local lumiphor may be designed to emit light that does not appreciably excite the remote lumiphor (e.g., less than 25% of the radiation emitted by local lumiphor will excite luminescent materials in the remote lumiphor). This can reduce the occurrences of "multiple conversions" where a photon of light is wavelength-converted by luminescent materials more than once before exiting the lighting device. This may be advantageous, as the more multiple conversions that occur the lower the efficiency of the lighting device.

Additionally, as noted above, the ratio of the surface areas of the facing surfaces of the remote and local lumiphors may exceed 20:1, 50:1 or even 100:1 in certain embodiments of the present invention. As discussed below with reference to FIG. 6, such a design can reduce absorption losses for the lighting device.

Figure 6:
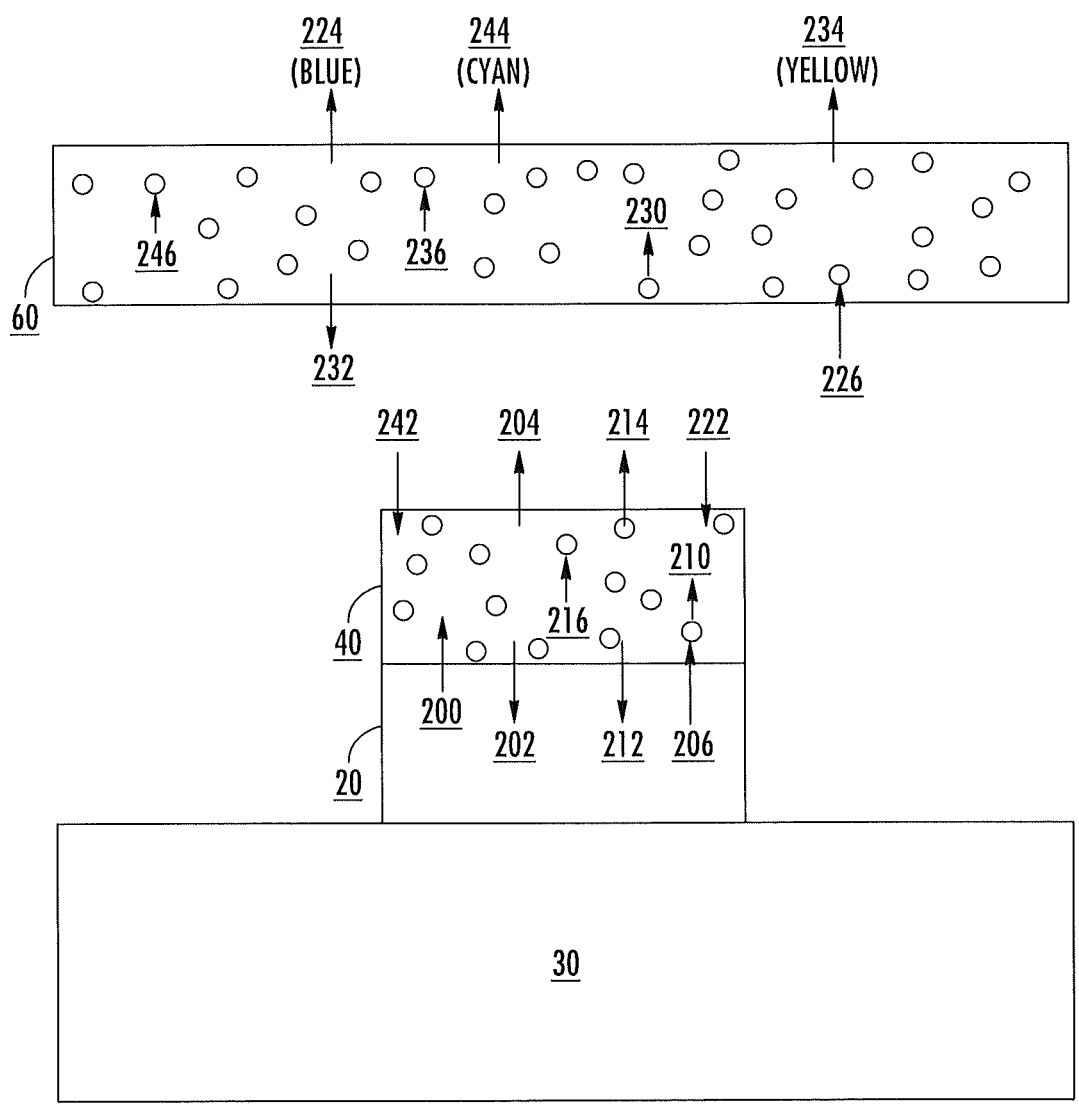
FIG. 6 is a schematic diagram that illustrates how backscattering of light can lead to absorption that reduces the luminous output of a lighting device.

In particular, FIG. 6 is a schematic diagram that illustrates how backscattering of light can lead to absorption that reduces the luminous output of, for example, the lighting device 10 of FIGS. 2A and 2B. As shown in FIG. 6, blue light 200 that is emitted by the blue LED 20 enters the local lumiphor 40. A first portion 202 of this blue light is reflected back into the LED chip 20, a second portion 204 passes through the local lumiphor 40 without conversion, and a third portion 206 is absorbed by luminescent materials such as phosphor particles (here we will assume that these phosphor particles emit light in the cyan color range) in the local lumiphor 40. Some of the blue light 202 that is reflected into LED chip 20 will be absorbed by the LED chip 20, while other portions of the blue light 202 will be reflected back into the local lumiphor 40, where it will appear just like the blue light 200 and hence will become part of the first through third portions 202, 204, 206 of blue light described above.

The third portion 206 of the blue light that is absorbed by phosphor particles will cause some of the phosphor particles to emit cyan colored light 210. As is also shown in FIG. 6, a first portion 212 of this cyan light may be reflected back into the LED chip 20 (due to, for example, collisions with other elements in the local lumiphor 40), a second portion 214 of the cyan light passes the rest of the way through the local lumiphor 40, a third portion 216 of the cyan light is absorbed by phosphor particles, which may or may not result in the re-emission of additional cyan light. Some of the cyan light 212 that is reflected into LED chip 20 will be absorbed by the LED chip 20, while other portions of the cyan light 212 will be reflected back into the local lumiphor 40, where it will appear just like the cyan light 210 and hence will become part of the first through third portions 212, 214, 216 of cyan light described above.

The blue light 204 that passes unconverted through the local lumiphor 40 will include portions that (1) pass into the remote lumiphor (either directly or after various reflections) or (2) are reflected back into the local lumiphor 40. In particular, the blue light 204 that passes unconverted through the local lumiphor 40 includes a first portion 222 that is reflected back into local lumiphor 40 (e.g., after reflecting off a reflective surface in the optical cavity, the remote lumiphor 60, etc.), a second portion 224 that passes into and through the remote lumiphor 60 without conversion, and a third portion 226 that is absorbed by luminescent materials such as phosphor particles (here we will assume that these phosphor particles emit light in the yellow color range) in the remote lumiphor 60. Some of the blue light 222 that is reflected into the local lumiphor 40 will be absorbed by the local lumiphor 40 or the underlying LED chip 20, while other portions of the blue light 222 will be reflected back into the optical cavity where it will appear just like the blue light 204.

The third portion 226 of the blue light that is absorbed by phosphor particles in the remote lumiphor 60 will cause some of the phosphor particles to emit yellow colored light 230. As is also shown in FIG. 6, a first portion 232 of this yellow light may be reflected back into the optical cavity (due to, for example, collisions with other elements in the remote lumiphor 60), a second portion 234 of the yellow light passes the rest of the way through the remote lumiphor 60, and a third portion 236 of the yellow light is absorbed by other phosphor particles in the remote lumiphor 60, which may or may not result in the re-emission of additional yellow light. Some of the yellow light 232 that is reflected into the optical cavity will be absorbed by the LED chip 20 or the local lumiphor 40, while other portions of the yellow light 232 will be reflected back into the remote lumiphor 60, where it will appear just like the yellow light 236.

Likewise, the cyan light 214 that escape the local lumiphor 40 will include portions that (1) pass into the remote lumiphor 60 (either directly or after various reflections) or (2) are reflected back into the local lumiphor 40. In particular, the cyan light 214 that escapes the local lumiphor 40 includes a first portion 242 that is reflected back into the local lumiphor 40 (e.g., after reflecting off a reflective surface in the optical cavity, the remote lumiphor 60, etc.), a second portion 244 that passes into and through the remote lumiphor 60 without conversion, and a third portion 246 that is absorbed by phosphor particles in the remote lumiphor 60. Some of the cyan light 242 that is reflected into the local lumiphor 40 will be absorbed by the local lumiphor 40 or the underlying LED chip 20, while other portions of the cyan light 242 will be reflected back into the optical cavity where it will appear just like the cyan light 214.

The third portion 246 of the cyan light that is absorbed by phosphor particles in the remote lumiphor 60 will typically not cause the phosphor particles to emit yellow colored light 230, as the phosphor particles may be chosen so that they have low excitation to cyan colored light, which will help limit the amount of absorption of the cyan light by the phosphor particles in the remote lumiphor 60. As shown in FIG. 6, the light exiting the lighting device 10 may include the unconverted blue light 224, the yellow colored light 234 from the phosphor particles in the remote lumiphor, and the cyan colored light 244 from the phosphor particles in the local lumiphor that pass unconverted through the remote lumiphor.

Numerous parameters effect the efficiency of a lumiphor coated LED. Those parameters include (1) the amount of light that is emitted by the LED that is absorbed by elements within the optical cavity and lost and (2) the degree to which light is absorbed and reemitted by luminescent materials multiple times before exiting the optical cavity, as such phosphor conversions also include efficiency losses. The discussion above with respect to FIG. 6 helps illustrate how the lighting devices according to embodiments of the present invention may provide increased efficiency.

In particular, as shown by the above discussion, light of various colors may be reflected off of elements in the local lumiphor 40 and/or in the remote lumiphor 60. Such reflections are typically referred to as "back-scattering." Back-scattered light that hits reflective surfaces in the optical cavity tends to just be reflected again, where it can pass into the local lumiphor 40 or, more likely, into the much larger remote lumiphor 60. While a small amount of light that hits these reflective surfaces may be absorbed, the amount of absorption into the reflective surfaces tends to be small (e.g., 2-3%) and hence may not significantly impact the efficiency of the lighting device 10.

In contrast, the light that is reflected back into the LED 20 tends to experience much higher absorption losses, which losses can more significantly impact the efficiency of the lighting device 10. If the remote lumiphor 60 is coated directly on top of the local lumiphor 40, then a fairly high percentage of the light that is reflected in the remote lumiphor 60 may be reflected back into the local lumiphor 40 and the LED chip 20, where high absorption losses may occur. However, by spacing the remote lumiphor 60 apart from the local lumiphor 40, most of the light reflected by the remote lumiphor 60 will hit the various reflective surfaces in the optical cavity instead of impinging on the local lumiphor 40 and LED chip 20, as the size of the pattern of the light reflected by the remote lumiphor 60 will increase exponentially with distance, much like the pattern of the pellets fired by a shotgun. Consequently, if the area of a lower surface of the remote lumiphor 60 is made to be substantially larger than the area of an upper surface of the LED chip 20, and if the distance between the LED chip 20 and the remote lumiphor 60 is increased, then it may be possible to greatly reduce the amount of light that is reabsorbed into the LED chip 20 and lost.

As also noted above, the efficiency of a lighting device 10 may also depend upon the extent to which light is absorbed and re-emitted multiple time by luminescent materials included in the lumiphors 40, 60 thereof. Once again, by separating the remote lumiphor 60 from the local lumiphor 40 it may be possible to reduce the amount of back-scattered light that enters the local lumiphor 40 where such re-absorption can occur.

In light of the above, pursuant to some embodiments of the present invention, the remote lumiphor 60 may be positioned at least 2 mm from the local lumiphor 40. In some embodiments, the remote lumiphor 60 may be positioned at least 4 mm or even at least 6 mm from the local lumiphor 40. As noted above, by spacing the remote lumiphor 60 apart from the local lumiphor 40 the amount of light that back-scatters into the local lumiphor 40 and/or the LED 20 may be advantageously reduced.

Photons of light from the LED 20 may pass through the local lumiphor 40 and exit a top surface thereof, and then pass through the optical cavity and enter the remote lumiphor 60 via a lower surface thereof. As noted above, the surface area of the lower surface of the remote lumiphor 60 that receives light from the local lumiphor 40 may be, in some embodiments, at least ten or even twenty times greater than the surface area of the upper surface of the local lumiphor 40. In other embodiments, the surface of the lower surface of the remote lumiphor 60 may be at least fifty times greater than the surface area of the upper surface of the local lumiphor 40. In still other embodiments, the surface area of the lower surface of the remote lumiphor 60 may be at least 100 times greater than the surface area of the upper surface of the local lumiphor 40.

As noted above, in some embodiments, more than a single LED chip 20 may be included in the optical cavity. In such embodiments, a single local lumiphor 40 may be coated over all of the LED chips 20 that include lumiphors, a separate local lumiphor 40 may be provided for each such LED chip 20, or these two approaches can be combined. In such devices, the lighting device may include a single remote lumiphor 60 or, alternatively, a plurality of remote lumiphors 60 may be provided. In such multi-LED chip embodiments of the present invention, the sum of the surface areas of the lower surfaces of the one or more remote lumiphors 60 may be at least ten, twenty, fifty or even 100 times greater than the sum of the surface areas of the upper surfaces of the one or more local lumiphors 40.

As the absorption losses that occurs in the LED chips with respect to back-scattered light may exceed the losses that occur in the local lumiphors 40, embodiments of the present invention also define the ratio of the surface area of the lower surface of the remote lumiphor 60 to the sum of the surface areas of the top surfaces of the LED chips 20. In some embodiments, the surface area of the lower surface of the one or more remote lumiphors 60 may be at least ten or even at least twenty times greater than the sum of the surface areas of the top surfaces of the LED chips 20. In other embodiments, the surface area of the lower surface of the one or more remote lumiphors 60 may be at least fifty times greater than the sum of the surface areas of the top surfaces of the LED chips 20. In still other embodiments, the surface area of the lower surface of the one or more remote lumiphors 60 may be at least 100 times greater than the sum of the surface areas of the top surfaces of the LED chips 20.

Figure 7M:
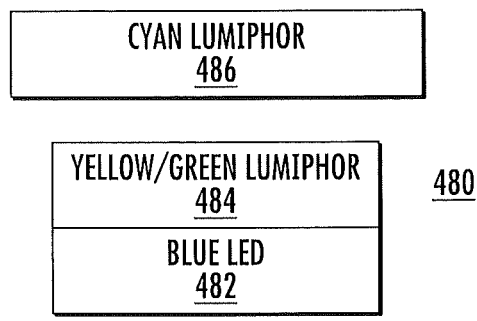
FIGS. 7A-Q are schematic block diagrams of lighting devices according to various embodiments of the present invention.
Figure 7N:
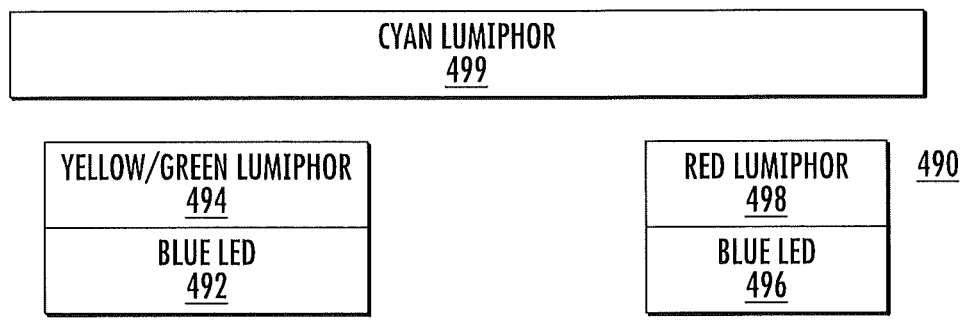
Figure 7O:
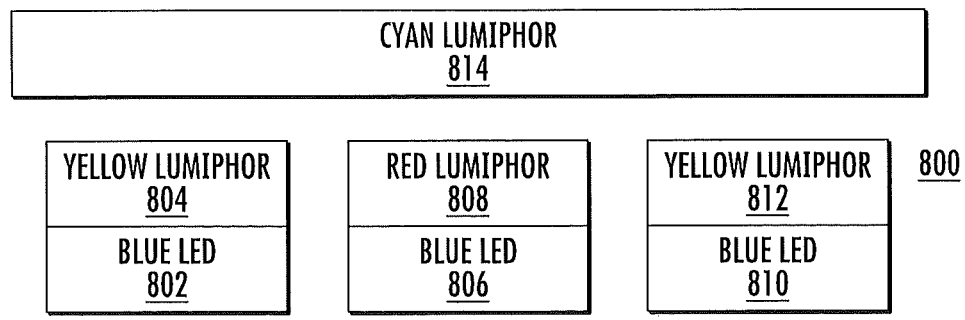
Figure 7P:
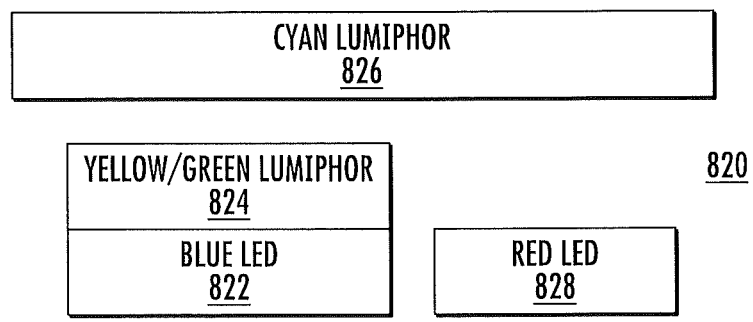
Figure 7Q:
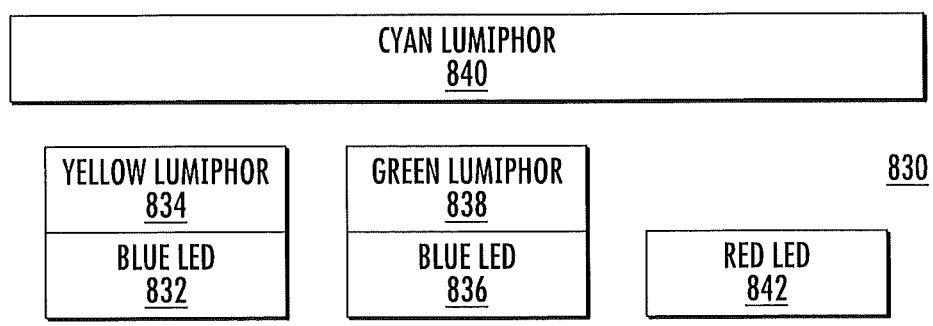

FIGS. 7A-Q are schematic block diagrams of lighting devices according to various embodiments of the present invention. In particular, FIGS. 7A-Q illustrate different combinations of LEDs, local lumiphors and remote lumiphors that may be used to provide lighting devices that emit warm white light and/or have relatively high CRI Ra values. In FIGS. 7A-Q, only one of each different type of LED (and any associated local lumiphor) that is included in the lighting device is depicted to simplify the drawings. However, it will be appreciated that more than one of some or all of these LEDs and associated local lumiphors may be provided in each depicted embodiment.

Turning first to FIG. 7A, a lighting device 300 is depicted that includes a blue LED 302. A local lumiphor 304 that includes cyan light-emitting luminescent materials is deposited on and/or around the blue LED 302. A remote lumiphor 306 that includes yellow light emitting luminescent materials is spaced-apart from the local lumiphor 304 and positioned to receive light emitted by the local lumiphor 304. Both cyan light that is generated by the cyan light-emitting luminescent materials and blue light from the LED 302 that is not converted by any of the cyan light-emitting luminescent materials is emitted through the top surface of the local lumiphor 304. The local lumiphor 304 may be a "leaky" lumiphor in that it may allow at least 10% of the received blue light to pass unconverted therethrough. The unconverted blue light that passes through the local lumiphor 304 may excite the yellow-light emitting luminescent materials in the remote lumiphor 306. The combination of blue light that passes unconverted through both the local and remote lumiphors 304, 306, the cyan light that is generated in the local lumiphor 304 that passes through the remote lumiphor 306, and the yellow light that is generated in the remote lumiphor 306 and passes therethrough combines to generate white light. The provision of the cyan light in the emitted emission spectrum may improve the CRI Ra value of the device 300.

FIG. 7B depicts a lighting device 310 that includes a blue LED 312. A local lumiphor 314 that includes red light-emitting luminescent materials is deposited on and/or around the blue LED 312. A remote lumiphor 316 that includes yellow light emitting luminescent materials is spaced-apart from the local lumiphor 314 and positioned to receive light emitted by the local lumiphor 314. Both red light that is generated by the red light-emitting luminescent materials and blue light from the LED 312 that is not converted by any of the red light-emitting luminescent materials passes through the local lumiphor 314, which may be a "leaky" lumiphor. The unconverted blue light that passes through the local lumiphor 314 may excite the yellow-light emitting luminescent materials in the remote lumiphor 316. The combination of blue light, yellow light and red light that is emitted from the remote lumiphor 316 combines to generate warm white light.

FIG. 7C depicts a lighting device 320 that includes a first blue LED 322. A first local lumiphor 324 that includes cyan light-emitting luminescent materials is deposited on and/or around the first blue LED 322. A second blue LED 326 is provided, and a second local lumiphor 328 that includes red light-emitting luminescent materials is deposited on and/or around the second blue LED 326. A remote lumiphor 330 that includes yellow light emitting luminescent materials is spaced-apart from the first and second local lumiphors 324, 328 and positioned to receive light emitted by the first local and second local lumiphors 324, 328. Cyan light that is generated by the cyan light-emitting luminescent materials, red light that is generated by the red light-emitting luminescent materials and unconverted blue light from the LEDs 322, 326 pass into the remote lumiphor 330. The unconverted blue light may excite the yellow-light emitting luminescent materials in the remote lumiphor 330. The combination of blue light, cyan light, yellow light and red light that is emitted from the remote lumiphor 330 combines to generate warm white light that may have a high CRI Ra value.

FIG. 7D depicts a lighting device 340 that includes a blue LED 342. A local lumiphor 344 that includes cyan light-emitting luminescent materials is deposited on and/or around the blue LED 342. A remote lumiphor 346 that includes green light emitting luminescent materials is spaced-apart from the local lumiphor 344 and positioned to receive light emitted by the local lumiphor 344. Both cyan light that is generated by the cyan light-emitting luminescent materials and blue light from the LED 342 that is not converted by any of the cyan light-emitting luminescent materials pass through the local lumiphor 344, which may be a leaky lumiphor. The unconverted blue light that passes through the local lumiphor 344 may excite the green-light emitting luminescent materials in the remote lumiphor 346. The combination of blue light, cyan light and green light that is emitted from the remote lumiphor 346 combines to generate white light.

FIG. 7E schematically depicts a lighting device 350 that includes a blue LED 352. A local lumiphor 354 that includes red light-emitting luminescent materials is deposited on and/or around the blue LED 352. A remote lumiphor 356 that includes green light emitting luminescent materials is spaced-apart from the local lumiphor 354 and positioned to receive light emitted by the local lumiphor 354. Both red light that is generated by the red light emitting luminescent materials and blue light from the LED 352 that is not converted by any of the red light emitting luminescent materials pass through the local lumiphor 354, which may be a leaky lumiphor. The unconverted blue light that passes through the local lumiphor 354 may excite the green light emitting luminescent materials in the remote lumiphor 356. The combination of blue light, green light and red light that is emitted from the remote lumiphor 356 combines to generate warm white light.

FIG. 7F depicts a lighting device 360 that includes a first blue LED 362. A first local lumiphor 364 that includes cyan light-emitting luminescent materials is deposited on and/or around the first blue LED 362. A second blue LED 366 is provided, and a second local lumiphor 368 that includes red light-emitting luminescent materials is deposited on and/or around the second blue LED 366. A remote lumiphor 370 that includes green light emitting luminescent materials is spaced-apart from the first and second local lumiphors 364, 368 and positioned to receive light emitted by the first local and second local lumiphors 364, 368. Cyan light that is generated by the cyan light-emitting luminescent materials, red light that is generated by the red light-emitting luminescent materials and unconverted blue light from the LEDs 362, 366 pass into the remote lumiphor 370. The unconverted blue light may excite the green-light emitting luminescent materials in the remote lumiphor 370. The combination of blue light, cyan light, green light and red light that is emitted from the remote lumiphor 370 combines to generate warm white light that may have a high CRI Ra value.

FIG. 7G depicts a lighting device 380 according to still further embodiments of the present invention. As shown in FIG. 7G, the lighting device 380 includes a first blue LED 382 that has a first local lumiphor 384 that includes cyan light-emitting luminescent materials deposited thereon. A second blue LED 386 is provided, and a second local lumiphor 388 that includes red light-emitting luminescent materials is deposited on and/or around the second blue LED 386. A third blue LED 390 is provided, and a third local lumiphor 392 that includes green light-emitting luminescent materials is deposited on and/or around the third blue LED 390. A remote lumiphor 394 that includes yellow light-emitting luminescent materials is spaced-apart from the first, second and third local lumiphors 384, 388, 392 and positioned to receive light emitted by the first, second and third local lumiphors 384, 388, 392. Cyan light that is generated by the cyan light-emitting luminescent materials, red light that is generated by the red light-emitting luminescent materials, green light that is generated by the green light-emitting luminescent materials and unconverted blue light from the LEDs 382, 386, 390 pass into the remote lumiphor 394. The unconverted blue light may excite the yellow-light emitting luminescent materials in the remote lumiphor 394. The combination of blue light, cyan light, yellow light, green light and red light that is emitted from the remote lumiphor 394 combines to generate warm white light that may have a high CRI Ra value.

FIG. 7H depicts a lighting device 400 according to still further embodiments of the present invention that includes a first blue LED 402 that has a first local lumiphor 404 that includes cyan light-emitting luminescent materials deposited thereon. A second blue LED 406 is provided, and a second local lumiphor 408 that includes red light-emitting luminescent materials is deposited on and/or around the second blue LED 406. A third blue LED 410 is provided, and a third local lumiphor 412 that includes yellow light-emitting luminescent materials is deposited on and/or around the third blue LED 410. A remote lumiphor 414 that includes green light-emitting luminescent materials is spaced-apart from the first, second and third local lumiphors 404, 408, 412 and positioned to receive light emitted by the first, second and third local lumiphors 404, 408, 412. Cyan light that is generated by the cyan light emitting luminescent materials, red light that is generated by the red light emitting luminescent materials, yellow light that is generated by the yellow light emitting luminescent materials and unconverted blue light from the LEDs 402, 406, 410 pass into the remote lumiphor 414. The unconverted blue light may excite the green-light emitting luminescent materials in the remote lumiphor 414. The combination of blue light, cyan light, yellow light, green light and red light that is emitted from the remote lumiphor 414 combines to generate warm white light that may have a high CRI Ra value.

FIG. 7I depicts a lighting device 420 that includes a blue LED 422. A local lumiphor 424 that includes cyan light-emitting luminescent materials is deposited on and/or around the blue LED 422. A remote lumiphor 426 that includes yellow light emitting luminescent materials is spaced-apart from the local lumiphor 424 and positioned to receive light emitted by the local lumiphor 424. Both cyan light that is generated by the cyan light-emitting luminescent materials and blue light from the LED 422 that is not converted by any of the cyan light-emitting luminescent materials pass through the local lumiphor 424. The unconverted blue light may excite the yellow-light emitting luminescent materials in the remote lumiphor 426. The device 420 further includes a red light emitting LED 428 such as an AlInGaP based LED, and light from the LED 428 may also pass unconverted through the remote lumiphor 426. The combination of blue light, yellow light, red light and cyan light that is emitted from the remote lumiphor 426 combines to generate white light.

FIG. 7J depicts a lighting device 430 that includes a blue LED 432. A local lumiphor 434 that includes cyan light-emitting luminescent materials is deposited on and/or around the blue LED 432. A remote lumiphor 436 that includes green light emitting luminescent materials is spaced-apart from the local lumiphor 434 and positioned to receive light emitted by the local lumiphor 434. Both cyan light that is generated by the cyan light-emitting luminescent materials and blue light from the LED 432 that is not converted by any of the cyan light-emitting luminescent materials pass through the local lumiphor 434. The unconverted blue light may excite the green-light emitting luminescent materials in the remote lumiphor 436. The device 430 further includes a red light emitting LED 438 such as an AlInGaP based LED, and light from the LED 438 may also pass unconverted through the remote lumiphor 436. The combination of blue light, green light, red light and cyan light that is emitted from the remote lumiphor 436 combines to generate white light.

FIG. 7K depicts a lighting device 440 that includes a first blue LED 442. A first local lumiphor 444 that includes cyan light-emitting luminescent materials is deposited on and/or around the first blue LED 442. A second blue LED 446 is provided, and a second local lumiphor 448 that includes green light-emitting luminescent materials is deposited on and/or around the second blue LED 446. A remote lumiphor 450 that includes yellow light emitting luminescent materials is spaced-apart from the first and second local lumiphors 444, 448 and positioned to receive light emitted by the first local and second local lumiphors 444, 448. Cyan light that is generated by the cyan light-emitting luminescent materials, green light that is generated by the green light-emitting luminescent materials and unconverted blue light from the LEDs 442, 446 pass into the remote lumiphor 450. The unconverted blue light may excite the yellow-light emitting luminescent materials in the remote lumiphor 450. The device 440 further includes a red light emitting LED 452 such as an AlInGaP based LED, and light from the LED 452 may also pass unconverted through the remote lumiphor 450. The combination of blue light, cyan light, green light, yellow light and red light that is emitted by the device 440 combines to generate warm white light that may have a high CRI Ra value.

FIG. 7L depicts a lighting device 460 that includes a first blue LED 462. A first local lumiphor 464 that includes cyan light-emitting luminescent materials is deposited on and/or around the first blue LED 462. A second blue LED 466 is provided, and a second local lumiphor 468 that includes yellow light-emitting luminescent materials is deposited on and/or around the second blue LED 466. A remote lumiphor 470 that includes green light emitting luminescent materials is spaced-apart from the first and second local lumiphors 464, 468 and positioned to receive light emitted by the first local and second local lumiphors 464, 468. Cyan light that is generated by the cyan light-emitting luminescent materials, yellow light that is generated by the yellow light-emitting luminescent materials and unconverted blue light from the LEDs 462, 466 pass into the remote lumiphor 470. The unconverted blue light may excite the green-light emitting luminescent materials in the remote lumiphor 470. The device 460 further includes a red light emitting LED 472 such as an AlInGaP based LED, and light from the LED 472 may also pass unconverted through the remote lumiphor 470. The combination of blue light, cyan light, green light, yellow light and red light that is emitted by the device 460 combines to generate warm white light that may have a high CRI Ra value.

FIG. 7M depicts a lighting device 480 that includes a blue LED 482. A local lumiphor 484 that includes yellow and/or green light-emitting luminescent materials is deposited on and/or around the blue LED 482. A remote lumiphor 486 that includes cyan light emitting luminescent materials is spaced-apart from the local lumiphor 484 and positioned to receive light emitted by the local lumiphor 3484. Both yellow and/or green light that is generated by the yellow and/or green light-emitting luminescent materials and blue light from the LED 482 that is not converted by any of the yellow and/or green light-emitting luminescent materials passes through the local lumiphor 484, which may be a "leaky" lumiphor. The unconverted blue light that passes through the local lumiphor 484 may excite the cyan-light emitting luminescent materials in the remote lumiphor 486. In some cases, the yellow and/or green light that is emitted by the local lumiphor 484 may also excite the cyan-light emitting luminescent materials in the remote lumiphor 486. The combination of blue light, yellow and/or green light and cyan light that is emitted from the remote lumiphor 486 combines to generate warm white light.

FIG. 7N depicts a lighting device 490 that includes a first blue LED 492. A first local lumiphor 494 that includes yellow and/or green light-emitting luminescent materials is deposited on and/or around the first blue LED 492. A second blue LED 496 is provided, and a second local lumiphor 498 that includes red light-emitting luminescent materials is deposited on and/or around the second blue LED 496. A remote lumiphor 499 that includes cyan light emitting luminescent materials is spaced-apart from the first and second local lumiphors 494, 498 and positioned to receive light emitted by the first local and second local lumiphors 494, 498. Yellow and/or green light that is generated by the yellow and/or green light-emitting luminescent materials, red light that is generated by the red light-emitting luminescent materials and unconverted blue light from the LEDs 492, 496 pass into the remote lumiphor 499. The unconverted blue light may excite the cyan-light emitting luminescent materials in the remote lumiphor 499. In some cases, the yellow and/or green light that is emitted by the local lumiphor 494 may also excite the cyan-light emitting luminescent materials in the remote lumiphor 499. The combination of blue light, cyan light, yellow and/or green light and red light that is emitted from the remote lumiphor 330 combines to generate warm white light that may have a high CRI Ra value.

FIG. 7O depicts a lighting device 800 according to still further embodiments of the present invention. As shown in FIG. 7O, the lighting device 800 includes a first blue LED 802 that has a first local lumiphor 804 that includes yellow light-emitting luminescent materials deposited thereon. A second blue LED 806 is provided, and a second local lumiphor 808 that includes red light-emitting luminescent materials is deposited on and/or around the second blue LED 806. A third blue LED 810 is provided, and a third local lumiphor 812 that includes green light-emitting luminescent materials is deposited on and/or around the third blue LED 810. A remote lumiphor 814 that includes cyan light-emitting luminescent materials is spaced-apart from the first, second and third local lumiphors 804, 808, 812 and positioned to receive light emitted by the first, second and third local lumiphors 804, 808, 812. Yellow light that is generated by the yellow light-emitting luminescent materials, red light that is generated by the red light-emitting luminescent materials, green light that is generated by the green light-emitting luminescent materials and unconverted blue light from the LEDs 802, 806, 810 pass into the remote lumiphor 814. The unconverted blue light may excite the cyan-light emitting luminescent materials in the remote lumiphor 814. In some cases, the yellow light that is emitted by the local lumiphor 804 and/or the green light that is emitted by the local lumiphor 812 may also excite the cyan-light emitting luminescent materials in the remote lumiphor 814. The combination of blue light, cyan light, yellow light, green light and red light that is emitted from the remote lumiphor 814 combines to generate warm white light that may have a high CRI Ra value.

FIG. 7P depicts a lighting device 820 that includes a blue LED 822. A local lumiphor 824 that includes yellow and/or green light-emitting luminescent materials is deposited on and/or around the blue LED 822. A remote lumiphor 826 that includes cyan light emitting luminescent materials is spaced-apart from the local lumiphor 824 and positioned to receive light emitted by the local lumiphor 824. Both yellow and/or green light that is generated by the yellow and/or green light-emitting luminescent materials and blue light from the LED 822 that is not converted by any of the yellow and/or green light-emitting luminescent materials are received by the remote lumiphor 826. The unconverted blue light may excite the cyan-light emitting luminescent materials in the remote lumiphor 826. In some cases, the yellow and/or green light that is emitted by the local lumiphor 824 may also excite the cyan-light emitting luminescent materials in the remote lumiphor 826. The device 820 further includes a red light emitting LED 828 such as an AlInGaP based LED, and light from the LED 828 may also pass unconverted through the remote lumiphor 826. The combination of blue light, yellow light, red light and cyan light that is emitted from the remote lumiphor 826 combines to generate white light.

FIG. 7Q depicts a lighting device 830 that includes a first blue LED 832. A first local lumiphor 834 that includes yellow light-emitting luminescent materials is deposited on and/or around the first blue LED 832. A second blue LED 836 is provided, and a second local lumiphor 838 that includes green light-emitting luminescent materials is deposited on and/or around the second blue LED 836. A remote lumiphor 840 that includes cyan light emitting luminescent materials is spaced-apart from the first and second local lumiphors 834, 838 and positioned to receive light emitted by the first local and second local lumiphors 834, 838. Yellow light that is generated by the yellow light-emitting luminescent materials, green light that is generated by the green light-emitting luminescent materials and unconverted blue light from the LEDs 832, 836 pass into the remote lumiphor 840. The unconverted blue light may excite the cyan-light emitting luminescent materials in the remote lumiphor 840. In some cases, the yellow light that is emitted by the local lumiphor 834 and/or the green light that is emitted by the local lumiphor 838 may also excite the cyan-light emitting luminescent materials in the remote lumiphor 840. The device 830 further includes a red light emitting LED 842 such as an AlInGaP based LED, and light from the LED 842 may also pass unconverted through the remote lumiphor 840. The combination of blue light, cyan light, green light, yellow light and red light that is emitted by the device 830 combines to generate warm white light that may have a high CRI Ra value.

In the embodiments discussed above that include one or more saturated LEDs such as red light-emitting LEDs that do not include an associated lumiphor, the light from the LED may be allowed to pass through the remote lumiphor or, alternatively, the device may be designed so that some or all of the light emitted by the saturated LEDs pass around or beside the remote lumiphor. In some embodiments where the light from the saturated LEDs passes through the remote lumiphor, the remote lumiphor may be designed to mix the various colors of light that pass therethrough so that the light output by the lighting device will appear white in color. In other embodiments, a separate light mixer/diffuser may be provided that mixes the various colors together to generate light that appears white in color.

It will likewise be appreciated that any of the lighting devices depicted in FIGS. 7A-Q could also include one or more additional blue LEDs that do not include an associated local lumiphor. These additional blue LEDs may be used to provide additional blue light to increase the amount of blue light that excites luminescent materials in the remote lumiphor and/or to provide additional light in the blue color range that passes through the remote lumiphor as may be necessary to achieve a desired color point for the lighting device.

In some embodiments, either the local lumiphor or the remote lumiphor can include more than on type of luminescent material. By way of example, the lighting device 320 of FIG. 7C could be modified to have a single blue LED 322 and a single local lumiphor 324' on the blue LED 322 that includes both cyan light-emitting and red light-emitting luminescent materials, so that the blue LED 326 and the second local lumiphor 328 could be omitted. As another example, the lighting device 320 of FIG. 7C could alternatively be modified to include the single blue LED 322 and the first local lumiphor 324, and the remote lumiphor 330 could be replaced with a remote lumiphor 330' that includes both yellow light-emitting and red light-emitting luminescent materials. This design again would allow the second blue LED 326 and the second local lumiphor 328 to be omitted. It will be appreciated that at least the above embodiments that are depicted in FIGS. 7C, 7F-H, 7K-L, 7N-O and 7Q could be modified in the manner described above to include two or more of the luminescent materials in either or both the local lumiphor and/or the remote lumiphor. It will also be appreciated that the same type of luminescent materials may be included in both the local and remote lumiphor. For example, in the embodiment of FIG. 7A, yellow luminescent materials could be included in both the local lumiphor 304 and in the remote lumiphor 306.

While, as discussed above, embodiments of the present invention do not preclude including two different types of luminescent materials in the same lumiphor, in some cases it may be advantageous to only include a single type of luminescent material in each local and remote lumiphor. In particular, as discussed above, multiple conversions may occur as light passes through lumiphors having different luminescent materials, which may reduce the efficiency, and hence the luminous flux, of the lighting device. Thus, it may be more efficient to include a single type of luminescent material in each local and remote lumiphor in some embodiments. Thus, for example, in the lighting device 320 of FIG. 7C, the cyan light-emitting luminescent materials are included in first local lumiphor 324 that is associated with the blue LED 322, and the red light-emitting luminescent materials are included in the second local lumiphor 328 that is associated with the second blue LED 326, and thus each of the first and second local lumiphors 324, 328 and the remote lumiphor 330 only include a single type of luminescent material.

In addition, as discussed above with reference to FIG. 6, by spatially separating the local and remote lumiphors, the interaction between the luminescent materials in the two lumiphors can be reduced due to the fact that much of the back-scatter from the remote lumiphor will impinge upon reflective surfaces in the optical cavity instead of impinging on the local lumiphor. As an example, a lighting device that is constructed according to the design of FIG. 7A above may include nine 1 mm by 1 mm square blue LEDs, each of which has a thin local lumiphor that includes cyan phosphors coated on the top surfaces thereof. Thus, the total surface area of the top surface of the local lumiphors for these nine LEDs is approximately 9 square mm. The nine LEDs are mounted in adjoining reflective cups in a 3×3 array. A planar glass disk is mounted, for example, approximately 2-5 mm above the 3×3 LED array, and the disk may have a diameter of, for example, 25 mm. A remote lumiphor that includes YAG:Ce phosphors is coated on the lower surface of the glass disk. The surface area of the lower surface of the remote lumiphor is thus about 490 square mm, which is more than 50 times the surface area of the top surfaces of the local lumiphors. Consequently, if it is assumed that back-scattered light will have a relatively even distribution, then less than 2-3% of the back-scattered light will impinge on the local lumiphors where it is subject to experiencing multiple conversions and/or being absorbed within an underlying LEDs, while the remaining 97-98% of the back-scattered light will hit reflective surfaces such as the reflective cups. While some of the reflections off of these reflective surfaces may direct the light into a local lumiphor, and a small amount of the impinging light will be absorbed by the reflective surfaces, the vast majority of the light that hits the reflective surfaces will be reflected (directly or indirectly) back up into the remote lumiphor. If the 25 mm glass disk is replaced with a 38 mm glass disk, the surface area of the remote lumiphor is increased to about 1134 square mm, and hence the device may be designed so that potentially only about 1% of the back-scattered light may directly impinge on the local lumiphors. Consequently, by using a remote lumiphor that is sufficiently spatially separated from the local lumiphor(s) and which has a much greater surface area, the efficiency of the device may be further improved.

As noted above, in some embodiments, yellow light-emitting luminescent materials such as, for example YAG:Ce are included in the remote lumiphor. It may be advantageous to use such phosphors in the remote lumiphor because the remote lumiphor may have a much larger surface area than the local lumiphor. A number of yellow light emitting phosphors are available that are relatively inexpensive as compared to, for example, suitable red light emitting and/or cyan light emitting luminescent materials. Accordingly, in some cases, the overall cost of the lighting device may be reduced by using the yellow light emitting (or green light emitting) luminescent materials in the remote lumiphor. Moreover, as discussed above, some cyan light emitting and red light emitting luminescent materials may tend to have large particle sizes and therefore allow more blue light to pass through unconverted, which may be advantageous in some situations. Additionally, YAG:Ce phosphor particles may have a relatively low excitation response to light in either the cyan or red color ranges. For example, at wavelengths of 470 nm the excitation response of some YAG:Ce phosphors may be low, and at wavelengths of 500 nm the excitation response may again be low. As such, the amount of cyan and/or red light that will excite YAG:Ce phosphor particles may be relatively low, and hence using a YAG:Ce phosphor in the remote lumiphor may advantageously reduce the amount of multiple conversions that occurs where red or cyan light emitted by the local lumiphor(s), thereby improving the efficiency of the lighting device.

In some embodiments, the remote lumiphor may be coated onto a light diffuser or may be designed to act as a light diffuser. Such light diffusers are typically employed because the light from the various sources in many white LEDS (e.g., blue LEDs, cyan phosphors, yellow phosphors, red phosphors or LEDs, etc.) must be mixed in order for the light that is output to appear white to a human observer. As light diffusers typically add inefficiencies to a lighting device, designing the remote lumiphor to act as a diffuser may allow for an increase in the efficiency of the lighting device.

Figure 8A:
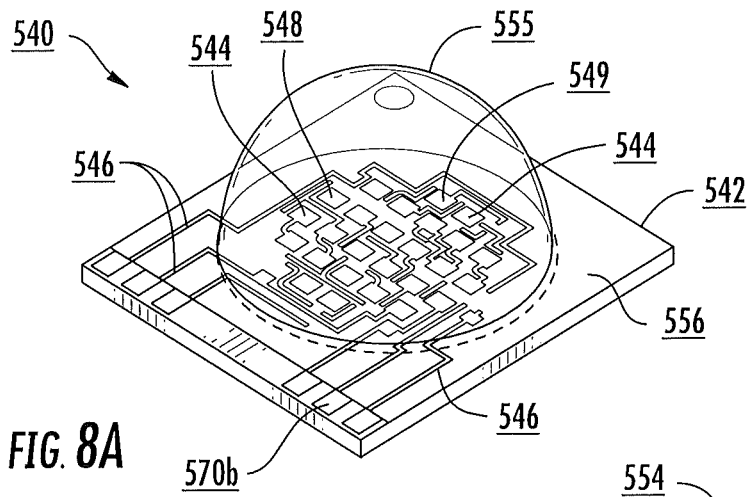
FIGS. 8A-D are various views of a lighting device according to certain embodiments of the present invention.
Figure 8B:
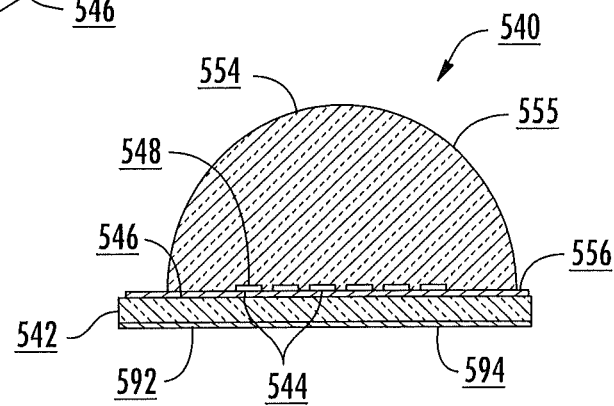
Figure 8C:
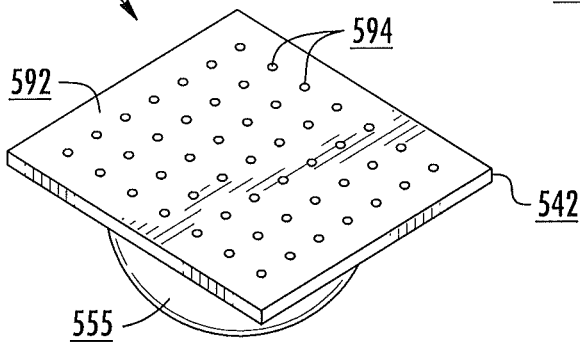
Figure 8D:
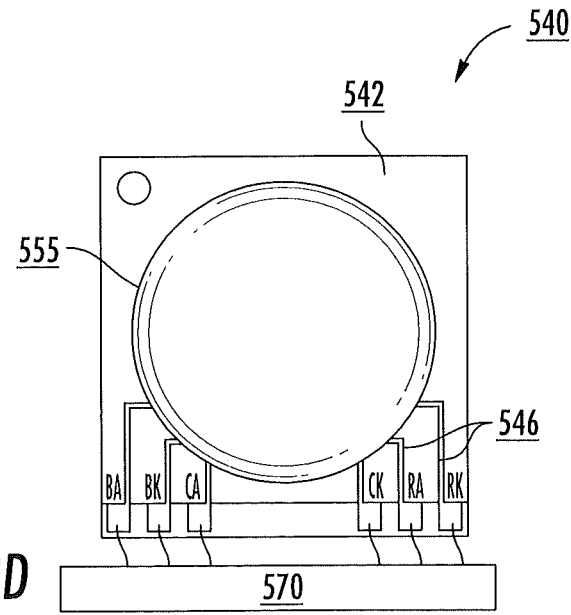

A lighting device 540 according to embodiments of the present invention will now be described with reference to FIGS. 8A-D. FIG. 8A is a top perspective view of the device 540. FIG. 8B is a side cross-sectional view of the device 540. FIG. 8C is a bottom perspective view of the device 540. FIG. 8D is a top plan view of the device 540.

As shown in FIG. 8A, the device 540 includes a submount 542 that supports an array of LEDs 548. The submount 540 can be formed of many different materials including either insulating materials, conductive materials or a combination thereof. For example, the submount 542 may be formed of alumina, aluminum oxide, aluminum nitride, silicon carbide, organic insulators, sapphire, copper, aluminum, steel, other metals or metal alloys, silicon, or of a polymeric material such as polyimide, polyester, etc. In some embodiments, the submount 542 may comprise a printed circuit board (PCB), which may facilitate providing electrical connections to and between a plurality of LEDs 548. Portions of the submount 542 may include or be coated with a highly reflective material, such as a reflective ceramic or metal (e.g., silver) to enhance light extraction from the device 540.

Each LED 548 is mounted to a respective die pad 544 that is provided on the top surface of the submount 542. Conductive traces 546 are also provided on the top surface of the submount 542. The die pads 544 and conductive traces 546 can comprise many different materials such as metals (e.g., copper) or other conductive materials, and may be deposited, for example, via plating and patterned using standard photo-lithographic processes. Seed layers and/or adhesion layers may be provided beneath the die pads 544. The die pads 544 may also include, or be plated with, reflective layers, barrier layers and/or dielectric layers. The LEDs 548 may be mounted to the die pads 544 using conventional methods such as soldering.

The LEDs 548 may comprise, for example, any of the LED combinations discussed above with respect to FIGS. 7A-L. For example, if the device 540 is designed to have the configuration of the device 320 of FIG. 7C above, then some number (e.g., 14) of the LEDs 548 may comprise blue LEDs that have a cyan light-emitting local lumiphor coated thereon, some number (e.g., 10) of the LEDs 548 may comprise blue LEDs that have a red light-emitting local lumiphor coated thereon, and some number (e.g., 1) of the LEDs 548 may comprise an additional blue LED that does not include a local lumiphor may be provided to provide additional blue light for exciting the phosphor particles in the remote lumiphor.

Each LED 548 may include at least one active layer/region sandwiched between oppositely doped epitaxial layers. The LEDs 548 may be grown as wafers of LEDs, and these wafers may be singulated into individual LED dies to provide the LEDs 548. The underlying growth substrate can optionally be fully or partially removed from each LED 548. Each LED 548 may include additional layers and elements including, for example, nucleation layers, contact layers, current spreading layers, light extraction layers and/or light extraction elements. The oppositely doped layers can comprise multiple layers and sub-layers, as well as super lattice structures and interlayers. The active region can include, for example, single quantum well (SQW), multiple quantum well (MQW), double heterostructure and/or super lattice structures. The active region and doped layers may be fabricated from various material systems, including, for example, Group-III nitride based material systems such as GaN, aluminum gallium nitride (AlGaN), indium gallium nitride (InGaN) and/or aluminum indium gallium nitride (AlInGaN). In some embodiments, the doped layers are GaN and/or AlGaN layers, and the active region is an InGaN layer.

Each LED 548 may include a conductive current spreading structure on its top surface, as well as one or more contacts/bond pads that are accessible at its top surface for wire bonding. The current spreading structure and contacts/bond pads can be made of a conductive material such as Au, Cu, Ni, In, Al, Ag or combinations thereof, conducting oxides and transparent conducting oxides. The current spreading structure may comprise spaced-apart conductive fingers that are arranged to enhance current spreading from the contacts/bond pads into the top surface of its respective LED 548. In operation, an electrical signal is applied to a contact/bond pad through a wire bond, and the electrical signal spreads through the fingers of the current spreading structure into the LED 548.

As noted above, some or all of the LEDs 548 may have an associated local lumiphor 549 that includes one or more luminescent materials. Light emitted by a respective one of the LEDs 548 may pass into its associated local lumiphor 549. Some of the light that passes into the local lumiphor 549 is absorbed by the luminescent materials contained therein, and the luminescent materials emit light having a different wavelength distribution in response to the absorbed light. The local lumiphor 549 may be coated directly onto its respective LED 548 or otherwise disposed to receive some or all of the light emitted by its respective LED 548. Suitable methods for applying the local lumiphor 549 to the LEDs 548 include, for example, the coating methods described in U.S. patent application Ser. Nos. 11/656,759 and 11/899,790, the electrophoretic deposition methods described in U.S. patent application Ser. No. 11/473,089, and/or the spray coating methods described in U.S. patent application Ser. No. 12/717,048.

An optical element or lens 555 may be provided over the LEDs 548 to provide environmental and/or mechanical protection. The lens 555 can be molded using different molding techniques such as those described in U.S. patent application Ser. No. 11/982,275. The lens 555 can be many different shapes such as, for example, hemispheric, ellipsoid bullet, flat, hex-shaped, and square, and can be formed of various materials such as silicones, plastics, epoxies or glass. The lens 555 can be textured to improve light extraction. For a generally circular LED array, the diameter of the lens 555 can be approximately the same as or larger than the diameter of the LED array.

The lens 555 may also include features or elements arranged to diffuse or scatter light, including scattering particles or structures. Such particles may include materials such as titanium dioxide, alumina, silicon carbide, gallium nitride, or glass micro spheres, with the particles preferably being dispersed within the lens. Alternatively, or in combination with the scattering particles, air bubbles or an immiscible mixture of polymers having a different index of refraction could be provided within the lens or structured on the lens to promote diffusion of light. Scattering particles or structures may be dispersed homogeneously throughout the lens 555 or may be provided in different concentrations or amounts in different areas in or on a lens. In one embodiment, scattering particles may be provided in layers within the lens, or may be provided in different concentrations in relation to the location of LEDs 548 (e.g., of different colors) within the packaged device 540. In other embodiments, a diffuser layer or film (not shown) may be disposed remotely from the lens 555 at a suitable distance from the lens 555, such as, for example, 1 mm, 5 mm, 10 mm, 20 mm, or greater. The diffuser film may be provided in any suitable shape, which may depend on the configuration of the lens 555. A curved diffuser film may be spaced apart from but conformed in shape to the lens and provided in a hemispherical or dome shape The lighting device 540 further includes at least one remote lumiphor 554. In some embodiments, the remote lumiphor 554 may be coated onto, sprayed or otherwise applied to a surface of the lens 555. The remote lumiphor 554 may include, for example, luminescent materials that are different from the luminescent materials contained in the local lumiphors 549. In some embodiments, the luminescent materials in the remote lumiphor 554 may be excited by light from some or all of the LEDs 548 that "leaks through" the local lumiphors 549. As noted above, some of the LEDs 548 may not include a local lumiphor 549, and some of the light from these "bare" LEDs 548 may also be used to excite the luminescent materials in the remote lumiphor 554. In some embodiments, the remote lumiphor 554 may be spaced apart from the local lumiphors 549 by, on average, at least 3 mm. The surface area of the lower surface of the remote lumiphor 554 (i.e., the surface that receives light from the local lumiphors 549) may exceed sum of the surface areas of the upper surfaces of the local lumiphors 549 by at least a factor of ten (or twenty or more).

The lighting device 540 may include an optional protective layer 556 that covers the top surface of the submount 542, e.g., in areas not covered by the lens 555. The protective layer 556 provides additional protection to the elements on the top surface to reduce damage and contamination during subsequent processing steps and use. The protective layer 556 may be formed concurrently with the lens 555, and optionally comprise the same material as the lens 555.

The lighting device 540 also includes one or more contact pairs 570 that provide external electrical connections that provide current to the LEDs 548.

To promote heat dissipation, the packaged device 540 may include a thermally conductive (e.g., metal) layer 592 on a bottom surface of the submount 542. The conductive layer 592 may cover different portions of the bottom surface of the submount 542; in one embodiment as shown, the metal layer 592 may cover substantially the entire bottom surface. The conductive layer 592 may be in at least partial vertical alignment with the LEDs 548. In one embodiment, the conductive layer is not in electrical communication with elements (e.g., LEDs) disposed on top surface of the submount 542. Heat that may concentrate below individual LEDs 548 will pass into the submount 542 disposed directly below and around each LED 548. The conductive layer 592 can aid heat dissipation by allowing this heat to spread from concentrated areas proximate the LEDs into the larger area of the layer 592 to promote dissipation and/or conductive transfer to an external heat sink (not shown). The conductive layer 592 may include holes 594 providing access to the submount 542, to relieve strain between the submount 542 and the metal layer 592 during fabrication and/or during operation. In certain embodiments, thermally conductive vias or plugs that pass at least partially through the submount 542 and are in thermal contact with the conductive layer 592 may be provided. The conductive vias or plugs promote passage of heat from the submount 542 to the conductive layer 592 to further enhance thermal management.

While FIGS. 8A-D illustrate one exemplary package configuration for light emitting devices according to embodiments of the present invention, it will be appreciated that any suitable packaging arrangement may be used.

Another potential benefit of including a remote lumiphor is that it may reduce the thickness of the local lumiphor. As noted above, lumiphors typically include binder materials such as silicone or epoxy resins. Unfortunately, these binder materials may break down over time if held at elevated temperatures. In order to reduce the likelihood of such breakdown occurring, the drive current supplied to LEDs that are coated with a local lumiphor may be limited to pre-selected amounts. The lower drive currents tend to reduce the amount of light generated by the lighting device.

As the lighting device according to embodiments of the present invention include a remote lumiphor, the thickness of any local lumiphor that is applied directly to the LEDs may be reduced. The thinner the coating, the better the ability of the LED to dissipate heat through the coating, and hence the LEDs that include remote lumiphors may be able to handle higher operating currents without breakdown of the binder materials.

Figure 9A:
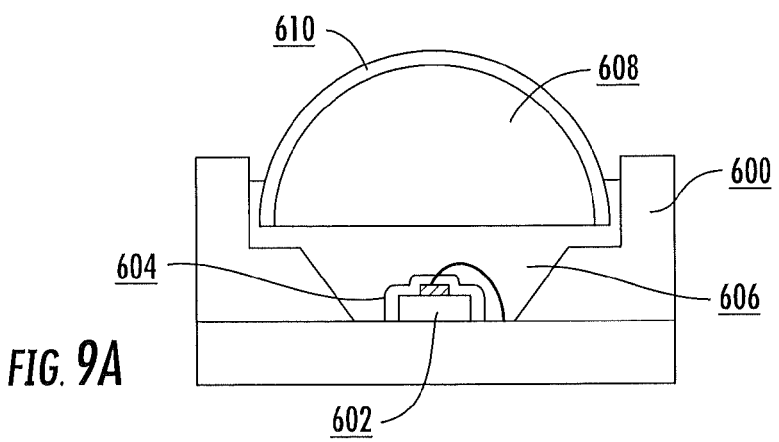
FIGS. 9A-C are schematic diagrams illustrating exemplary configurations for the remote lumiphors according to embodiments of the present invention.
Figure 9B:
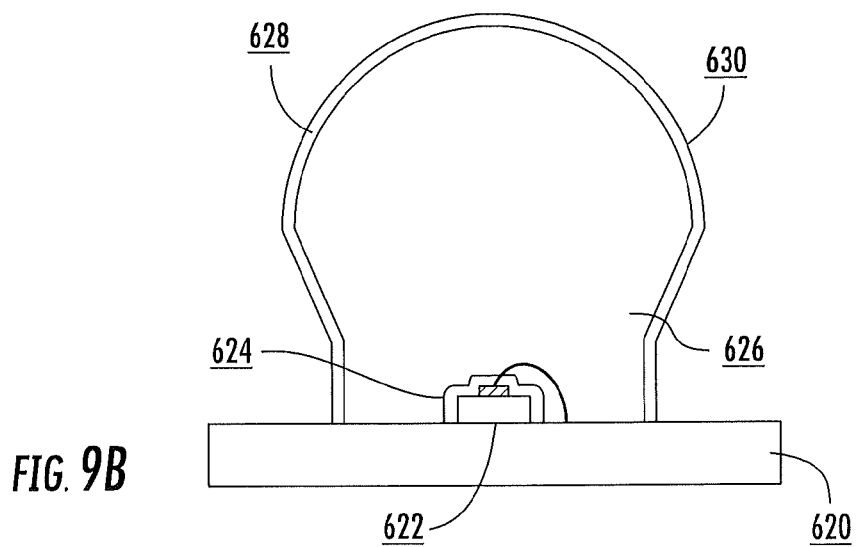
Figure 9C:
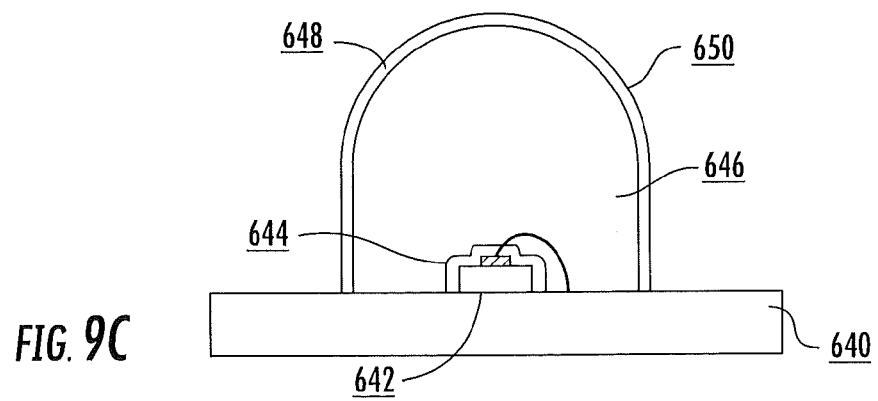

FIGS. 9A-C are schematic diagrams illustrating exemplary configurations for the remote lumiphors according to embodiments of the present invention.

As shown in FIG. 9A, in some embodiments, the lighting device includes a reflective cup or other mounting surface

600. An LED 602 is mounted in the reflective cup 600. A local lumiphor 604 is coated on the top and side surfaces of the LED 602. The reflective cup 600 defines an optical cavity 606. A hemispherical dome 608 is mounted to cover the optical cavity 606. A remote lumiphor 610 is coated onto the hemispherical dome 608.

FIG. 9B illustrates another embodiment, in which the lighting device includes a planar submount 620. An LED 622 is mounted on the submount 620. A local lumiphor 624 is coated on the top and side surfaces of the LED 622. A light bulb shaped dome 628 is mounted on the submount 620. The submount 620 and the dome 628 define an optical cavity 626. A remote lumiphor 630 is coated onto the dome 628.

FIG. 9C illustrates another embodiment, in which the lighting device includes a planar submount 640. An LED 642 is mounted on the submount 640. A local lumiphor 644 is coated on the top and side surfaces of the LED 642. A bullet-shaped dome 648 is mounted on the submount 640. The submount 640 and the dome 648 define an optical cavity 646. A remote lumiphor 650 is coated onto the dome 648.

Figure 10:
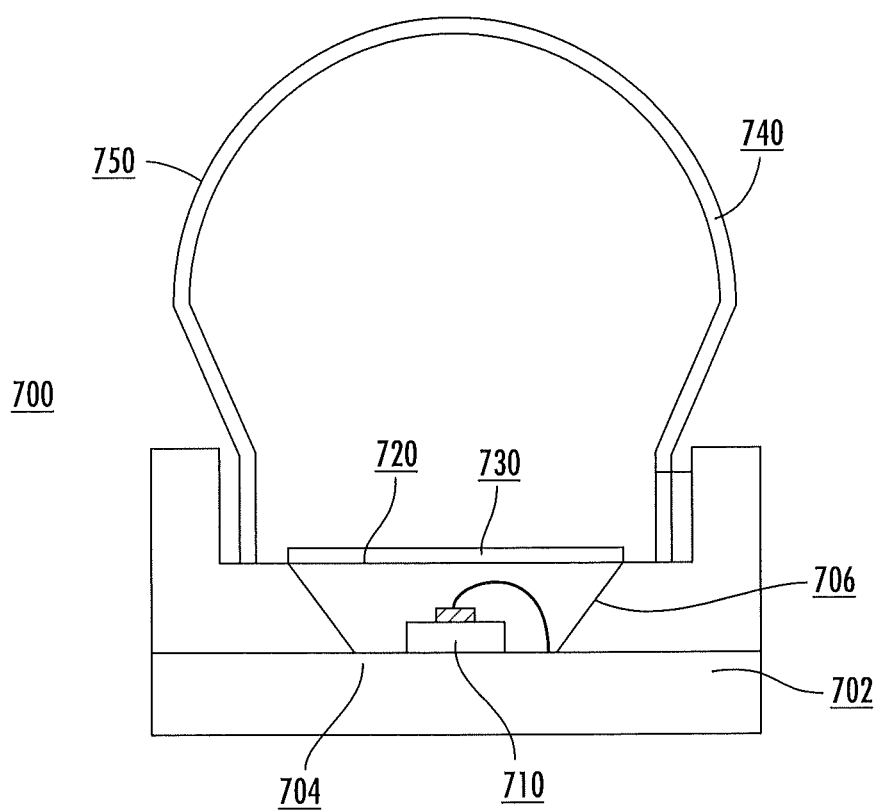
FIG. 10 is a schematic diagram illustrating a lighting device having spaced apart lumiphors where neither lumiphors is directly on an LED of the lighting device.

According to still further embodiments of the present invention, the local lumiphor in any of the above-described embodiments may be spatially separated from both its associated LED and from the remote lumiphor. FIG. 10 schematically illustrates such a lighting device 700.

As shown in FIG. 10, the lighting device 700 includes a reflective cup 702 that has a base 704 and sidewalls 706. An LED 710 is mounted on the base 704 of reflective cup 702. The top surfaces of the sidewalls 706 extend farther above the base 704 than does the top surface of the LED 710. A transparent element 720 is placed over the LED 710. The transparent element is spaced apart from the top surface of the LED 710. A local lumiphor 730 is coated on an upper surface of the transparent element 720. The local lumiphor 730 is thus spaced apart from the LED 710, and hence will receive less heat from the LED 710. A transparent lens 740 is positioned over the LED 710, reflective cup 702, transparent element 720 and local lumiphor 730. A remote lumiphor 750 may be coated, for example, on an inner surface of the lens 740. The remote lumiphor 750 is spaced apart from the local lumiphor 730.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

While embodiments of the present invention have primarily been discussed above with respect to semiconductor light emitting devices that include LEDs, it will be appreciated that according to further embodiments of the present invention, laser diodes and/or other semiconductor lighting devices may be provided that include the luminophoric mediums discussed above.

The present invention has been described above with reference to the accompanying drawings, in which certain embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that, when used in this specification, the terms "comprises" and/or "including" and derivatives thereof, specify the presence of stated features, operations, elements, and/or components, but do not preclude the presence or addition of one or more other features, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions and/or layers, these elements, components, regions and/or layers should not be limited by these terms. These terms are only used to distinguish one element, component, region or layer from another element, component, region or layer. Thus, a first element, component, region or layer discussed below could be termed a second element, component, region or layer without departing from the teachings of the present invention.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A lighting device, comprising:
a semiconductor light emitting device;
a first lumiphor that includes luminescent materials, the first lumiphor having a first surface that is positioned to receive radiation emitted by the semiconductor light emitting device and a second surface opposite the first surface;
a second lumiphor that is different from the first lumiphor, the second lumiphor having a first surface that is positioned to receive radiation emitted by the semiconductor light emitting device and radiation emitted by the luminescent materials in the first lumiphor, the second lumiphor being spaced-apart from the first lumiphor and from the semiconductor light emitting device;
wherein the first lumiphor comprises a leaky lumiphor in that the luminescent materials therein wavelength convert less than 90% of the radiation from the semiconductor light emitting device light that is incident on the first lumiphor,
wherein the blue LED comprises a first blue LED, the lighting device further comprising:
a second blue LED that emits radiation having a peak wavelength between 400 and 489 nm; and
a third lumiphor that includes different luminescent materials than the luminescent materials that are included in the first and second lumiphors, the third lumiphor having a first surface that is positioned to receive radiation emitted by the second blue LED,
wherein the second lumiphor is also positioned to receive radiation emitted by the second blue LED and is spaced-apart from the third lumiphor.

2. The lighting device of claim 1, wherein the luminescent materials in the first lumiphor emit light having a peak wavelength between 490 and 515 nm, wherein the luminescent materials in the second lumiphor emit light having a peak wavelength between 540 and 590 nm, and wherein the luminescent materials in the third lumiphor emit light having a dominant wavelength of at least 600 nm.

3. A lighting device, comprising:
a semiconductor light emitting device;
a first lumiphor that includes luminescent materials, the first lumiphor having a first surface that is positioned to receive radiation emitted by the semiconductor light emitting device and a second surface opposite the first surface;
a second lumiphor that is different from the first lumiphor, the second lumiphor having a first surface that is positioned to receive radiation emitted by the semiconductor light emitting device and radiation emitted by the luminescent materials in the first lumiphor, the second lumiphor being spaced-apart from the first lumiphor and from the semiconductor light emitting device;
wherein the first lumiphor comprises a leaky lumiphor in that the luminescent materials therein wavelength convert less than 90% of the radiation from the semiconductor light emitting device light that is incident on the first lumiphor,
wherein the second lumiphor includes luminescent materials that emit light having a peak wavelength between 510 and 599 nm,
wherein the light emitting device comprises a blue light emitting diode ("LED") that emits light having a peak wavelength between 400 and 489 nm, and wherein a combination of the blue light emitted by the blue LED and the light emitted by the luminescent materials in the second lumiphor has a color point that falls within the region on the 1931 CIE Chromaticity Diagram defined by x, y chromaticity coordinates (0.32, 0.40), (0.36, 0.48), (0.43 0.45), (0.36, 0.38), (0.32, 0.40).

4. A lighting device, comprising:
a semiconductor light emitting device;
a first lumiphor that includes luminescent materials, the first lumiphor having a first surface that is positioned to receive radiation emitted by the semiconductor light emitting device and a second surface opposite the first surface;
a second lumiphor that is different from the first lumiphor, the second lumiphor having a first surface that is positioned to receive radiation emitted by the semiconductor light emitting device and radiation emitted by the luminescent materials in the first lumiphor, the second lumiphor being spaced-apart from the first lumiphor and from the semiconductor light emitting device; and
a red LED that emits saturated radiation having a dominant wavelength of at least 600 nm, wherein the luminescent materials in the first lumiphor emit light having a peak wavelength between 490 and 515 nm, and wherein the second lumiphor is also positioned to receive radiation emitted by the red LED,
wherein the first lumiphor comprises a leaky lumiphor in that the luminescent materials therein wavelength convert less than 90% of the radiation from the semiconductor light emitting device light that is incident on the first lumiphor.

5. A lighting device, comprising:
a semiconductor light emitting device;
a first lumiphor that includes luminescent materials, the first lumiphor having a first surface that is positioned to receive radiation emitted by the semiconductor light emitting device and a second surface opposite the first surface;
a second lumiphor that is different from the first lumiphor, the second lumiphor having a first surface that is positioned to receive radiation emitted by the semiconductor light emitting device and radiation emitted by the luminescent materials in the first lumiphor, the second lumiphor being spaced-apart from the first lumiphor and from the semiconductor light emitting device;
wherein the first lumiphor comprises a leaky lumiphor in that the luminescent materials therein wavelength convert less than 90% of the radiation from the semiconductor light emitting device light that is incident on the first lumiphor,
wherein the second lumiphor includes luminescent materials that emit light having a peak wavelength between 510 and 599 nm,
wherein the light emitting device comprises a blue light emitting diode ("LED") that emits light having a peak wavelength between 400 and 489 nm, and wherein a combination of the blue light emitted by the blue LED and the light emitted by the luminescent materials in the second lumiphor has a color point that falls within the region on the 1931 CIE Chromaticity Diagram defined by x, y chromaticity coordinates (0.35, 0.48), (0.26, 0.50), (0.13 0.26), (0.15, 0.20), (0.26, 0.28), (0.35, 0.48).

6. A lighting device, comprising:
a semiconductor light emitting device;
a first lumiphor that includes luminescent materials, the first lumiphor having a first surface that is positioned to receive radiation emitted by the semiconductor light emitting device and a second surface opposite the first surface;

a second lumiphor that is different from the first lumiphor, the second lumiphor having a first surface that is positioned to receive radiation emitted by the semiconductor light emitting device and radiation emitted by the luminescent materials in the first lumiphor through the second surface of the first lumiphor, the second lumiphor being spaced-apart from the first lumiphor and from the semiconductor light emitting device;

wherein the first lumiphor comprises a leaky lumiphor in that the luminescent materials therein wavelength convert less than 90% of the radiation from the semiconductor light emitting device light that is incident on the first lumiphor;

wherein the lighting device emits a warm white light having a correlated color temperature between about 2500K and about 4100K and a CRI Ra value of at least 90.

7. The lighting device of claim 6, wherein the light emitting device comprises a blue light emitting diode ("LED") that emits light having a peak wavelength between 400 and 489 nm.

8. The lighting device of claim 6, wherein the luminescent materials in the first lumiphor emit light having a peak wavelength between 490 and 515 nm.

9. The lighting device of claim 6, wherein the luminescent materials in the first lumiphor emit light having a dominant wavelength of at least 600 nm.

10. The lighting device of claim 6, wherein a ratio of an average particle size of the luminescent materials in the first lumiphor to an average particle size of luminescent materials that are included in the second lumiphor is at least 4:1.

11. The lighting device of claim 6, wherein the first lumiphor is coated directly onto the blue LED.

12. The lighting device of claim 6, wherein the second lumiphor is directly on a portion of transparent element that is remote from the first lumiphor.

13. A lighting device, comprising:
a semiconductor light emitting device;
a first lumiphor that includes luminescent materials, the first lumiphor having a first surface that is positioned to receive radiation emitted by the semiconductor light emitting device and a second surface opposite the first surface;
a second lumiphor that is different from the first lumiphor, the second lumiphor having a first surface that is positioned to receive radiation emitted by the semiconductor light emitting device and radiation emitted by the luminescent materials in the first lumiphor, the second lumiphor being spaced-apart from the first lumiphor and from the semiconductor light emitting device;

wherein the first lumiphor comprises a leaky lumiphor in that the luminescent materials therein wavelength convert less than 90% of the radiation from the semiconductor light emitting device light that is incident on the first lumiphor, wherein a surface area of a lower surface of the second lumiphor that is opposite an upper surface of the first lumiphor is at least a factor of twenty larger than the upper surface of the first lumiphor.

14. The lighting device of claim 13, wherein the second lumiphor includes luminescent materials that emit light having a peak wavelength between 510 and 599 nm.

15. The lighting device of claim 13, wherein the luminescent materials in the first lumiphor emit light having a peak wavelength between 490 and 515 nm.

16. The lighting device of claim 13, wherein the luminescent materials in the first lumiphor emit light having a dominant wavelength of at least 600 nm.

17. The lighting device of claim 13, wherein the light emitting device comprises a blue light emitting diode ("LED") that emits light having a peak wavelength between 400 and 489 nm, and wherein the first lumiphor is directly on the blue LED.

18. A lighting device, comprising:
a semiconductor light emitting device;
a first lumiphor that includes luminescent materials, the first lumiphor having a first surface that is positioned to receive radiation emitted by the semiconductor light emitting device and a second surface opposite the first surface;
a second lumiphor that is different from the first lumiphor, the second lumiphor having a first surface that is positioned to receive radiation emitted by the semiconductor light emitting device and radiation emitted by the luminescent materials in the first lumiphor through the second surface of the first lumiphor, the second lumiphor being spaced-apart from the first lumiphor and from the semiconductor light emitting device;

wherein the first lumiphor comprises a leaky lumiphor in that the luminescent materials therein wavelength convert less than 90% of the radiation from the semiconductor light emitting device light that is incident on the first lumiphor, wherein the second lumiphor is positioned at least 2 mm from the first lumiphor.

19. The lighting device of claim 18, wherein the light emitting device comprises a blue light emitting diode ("LED") that emits light having a peak wavelength between 400 and 489 nm.

* * * * *